United States Patent
Li et al.

(10) Patent No.: US 11,133,369 B2
(45) Date of Patent: Sep. 28, 2021

(54) FLEXIBLE DISPLAY PANEL AND MANUFACTURING METHOD THEREOF

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Dehuai Li, Beijing (CN); Yongchao Guo, Beijing (CN); Xiang Fang, Beijing (CN); Bing Li, Beijing (CN); Jincheng He, Beijing (CN); Hao Sun, Beijing (CN); Siqing Fu, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/699,503

(22) Filed: Nov. 29, 2019

(65) Prior Publication Data

US 2020/0328267 A1    Oct. 15, 2020

(30) Foreign Application Priority Data

Apr. 10, 2019 (CN) .......................... 201910286412.9

(51) Int. Cl.
*H01L 27/32* (2006.01)
*H01L 51/52* (2006.01)
*H01L 51/56* (2006.01)
*H01L 51/00* (2006.01)
*H01L 27/12* (2006.01)

(52) U.S. Cl.
CPC ...... *H01L 27/3276* (2013.01); *H01L 27/1259* (2013.01); *H01L 27/3246* (2013.01); *H01L 51/0097* (2013.01); *H01L 51/5253* (2013.01); *H01L 51/56* (2013.01); *H01L 2227/323* (2013.01)

(58) Field of Classification Search
CPC ............ H01L 27/1259; H01L 27/3246; H01L 27/3276; H01L 2227/323; H01L 51/0097; H01L 51/5253; H01L 51/56; H01L 2251/5338; H01L 27/1248; Y02E 10/549
See application file for complete search history.

(56) References Cited

U.S. PATENT DOCUMENTS

| | | | | |
|---|---|---|---|---|
| 2004/0135501 A1* | 7/2004 | Nishikawa | .......... | H01L 51/0002 313/506 |
| 2005/0023969 A1* | 2/2005 | Omata | ................ | H01L 51/5209 313/504 |
| 2005/0133802 A1* | 6/2005 | Lee | ..................... | H01L 51/5284 257/95 |

(Continued)

*Primary Examiner* — Mary A Wilczewski

(57) ABSTRACT

A flexible display panel and a manufacturing method thereof are provided. The flexible display panel includes: a base substrate, a circuit structure layer, and a via hole; the circuit structure layer is located on an upper surface of the base substrate, a protrusion in an annular shape is provided at a side of the circuit structure layer away from the base substrate, the via hole penetrates the circuit structure layer, and the protrusion surrounds the via hole.

16 Claims, 8 Drawing Sheets

(56) References Cited

U.S. PATENT DOCUMENTS

| | | | |
|---|---|---|---|
| 2005/0156515 A1* | 7/2005 | Fukase | H01L 27/326 313/504 |
| 2005/0162080 A1* | 7/2005 | Yaegashi | H01L 27/3246 313/504 |
| 2005/0190253 A1* | 9/2005 | Duineveld | H01L 51/0014 347/106 |
| 2005/0200273 A1* | 9/2005 | Nozawa | H01L 51/5221 313/503 |
| 2005/0258745 A1* | 11/2005 | Tsujimura | H01L 27/3246 313/506 |
| 2005/0263757 A1* | 12/2005 | Lee | H01L 51/0011 257/40 |
| 2005/0269962 A1* | 12/2005 | Matsunaga | H01L 27/3244 315/169.3 |
| 2005/0285512 A1* | 12/2005 | Murayama | H01L 27/3283 313/504 |
| 2005/0287392 A1* | 12/2005 | Toyoda | H01L 51/5048 428/690 |
| 2006/0001033 A1* | 1/2006 | Tsujimura | H01L 27/3204 257/88 |
| 2006/0017375 A1* | 1/2006 | Noguchi | H01L 27/3279 313/504 |
| 2006/0022587 A1* | 2/2006 | Jeong | H01L 27/3246 313/504 |
| 2006/0024855 A1* | 2/2006 | Sano | H01L 51/0021 438/34 |
| 2010/0171415 A1* | 7/2010 | Akamatsu | H01L 27/3246 313/504 |
| 2017/0062528 A1* | 3/2017 | Aoyama | G02F 1/133514 |
| 2018/0182827 A1* | 6/2018 | Kim | H01L 27/3258 |
| 2019/0096970 A1* | 3/2019 | Hou | H01L 27/3211 |
| 2020/0043998 A1* | 2/2020 | Choi | H01L 27/3246 |
| 2020/0161391 A1* | 5/2020 | Zhang | H01L 27/3246 |
| 2020/0194513 A1* | 6/2020 | Kim | H01L 51/5072 |
| 2020/0328267 A1* | 10/2020 | Li | H01L 51/0097 |

* cited by examiner

FLEXIBLE DISPLAY PANEL AND MANUFACTURING METHOD THEREOF

CROSS-REFERENCE TO RELATED APPLICATION

The present application claims priority to the Chinese patent application No. 201910286412.9 filed on Apr. 10, 2019, the entire disclosure of which is incorporated herein by reference as part of the present application.

TECHNICAL FIELD

Embodiments of the present disclosure relate to a flexible display panel and a manufacturing method thereof.

BACKGROUND

As a next-generation display technology, a flexible display has attracted widespread attention for its advantages of being ultra-thin, light in weight, durable and the like. A flexible substrate has the potential to replace the traditional glass substrate on a large scale and is therefore considered to be the key to the development of the flexible display technology.

Moreover, with the development of display technology, a full screen display has received extensive attention for its large screen-to-body ratio, ultra-narrow bezel, and good visual effect. At present, in order to increase the screen-to-body ratio, a functional component such as front camera, earpiece, and fingerprint recognition sensor is usually integrated inside the screen or under the screen. In order to arrange the front camera and other components under the screen while ensuring the amount of light entering the camera, it is necessary to form a through hole by removing a portion of the screen located above the component such as the camera and the like (the through hole is a via hole penetrating the flexible display in a thickness direction) to place a front camera, an earpiece, a fingerprint recognition component or a physical button in the via hole. However, at present, there are still many problems involved in the manufacturing process of the through hole, which results in that the through hole is difficult to be manufactured, cannot be mass-manufactured, or is manufactured in a high production cost.

Therefore, there is a large research space in the process of manufacturing a via hole in a flexible display panel.

SUMMARY

On one aspect, embodiments of the present disclosure provide a flexible display panel, including: a base substrate; a circuit structure layer located on an upper surface of the base substrate; a protrusion in an annular shape being provided at a side of the circuit structure layer away from the base substrate; and a via hole penetrating the circuit structure layer, the via hole being surrounded by the protrusion.

In an embodiment of the present disclosure, the circuit structure layer includes a flexible filling layer, an orthographic projection of the protrusion on the base substrate covers an orthographic projection of the flexible filling layer on the base substrate.

In an embodiment of the present disclosure, the base substrate includes a first flexible layer; a first barrier layer located between the first flexible layer and the circuit structure layer; an amorphous silicon layer located on a surface of the first barrier layer close to the circuit structure layer; a second flexible layer located on a surface of the amorphous silicon layer close to the circuit structure layer; and a second barrier layer located on a surface of the second flexible layer close to the circuit structure layer; the via hole penetrates the first barrier layer, or the via hole penetrates both the first barrier layer and the first flexible layer, or the via hole penetrates both the first barrier layer and the amorphous silicon layer, or the via hole penetrates the first barrier layer, the amorphous silicon layer, and the first flexible layer, or the via hole penetrates the amorphous silicon layer, the second barrier layer and the first barrier layer, or the via hole penetrates the amorphous silicon layer, the second barrier layer, the first barrier layer, and at least one of the second flexible layer and the first flexible layer.

In an embodiment of the present disclosure, the circuit structure layer includes: a buffer layer located on the upper surface of the base substrate; a thin film transistor located on a surface of the buffer layer away from the base substrate and including an active layer, a gate electrode, a source electrode, and a drain electrode; a first gate insulation layer located between the active layer and the gate electrode; a second gate insulation layer located on a surface of the first gate insulation layer away from the base substrate and covering the gate electrode or the active layer; a first conductive wire layer located on a surface of the second gate insulation layer away from the base substrate; an interlayer dielectric layer located on the surface of the second gate insulation layer away from the base substrate and covering the first conductive wire layer, the source electrode and the drain electrode being located on a surface of the interlayer dielectric layer away from the base substrate; a first planarization layer located on the surface of the interlayer dielectric layer away from the base substrate and covering the source electrode and the drain electrode; a pixel defining layer located on a surface of the first planarization layer away from the base substrate; and a spacer layer located on a surface of the pixel defining layer away from the base substrate, the flexible filling layer being located between the interlayer dielectric layer and the pixel defining layer.

In an embodiment of the present disclosure, an orthographic projection of the thin film transistor adjacent to the via hole on the base substrate is not overlapped with an orthographic projection of the via hole on the base substrate.

In an embodiment of the present disclosure, the flexible filling layer is located on the surface of the interlayer dielectric layer away from the base substrate.

In an embodiment of the present disclosure, the circuit structure layer further includes: a passivation layer located on a surface of the first planarization layer close to the base substrate; a second conductive wire layer located on the surface of the first planarization layer away from the base substrate; and a second planarization layer located on the surface of the first planarization layer away from the base substrate and covering the second conductive wire layer.

In an embodiment of the present disclosure, the protrusion further includes a metal layer, an orthographic projection of the protrusion on the base substrate covers an orthographic projection of the metal layer on the base substrate, and the metal layer is at least one selected from the group consisting of: a first metal layer, the first metal layer and the source electrode being formed by a same material and located in a same layer; a second metal layer, the second metal layer and the gate electrode being formed by a same material and located in a same layer; a third metal layer, the third metal layer and the first conductive wire layer being formed by a same material and located in a same layer; a fourth metal layer, the fourth metal layer and the second conductive wire layer being formed by a same material and located in a same layer; and a fifth metal layer, the fifth metal layer and an anode of an organic light-emitting diode (OLED) component being formed by a same material and located in a same layer.

In an embodiment of the present disclosure, the flexible display panel further includes an encapsulation film configured to encapsulate the OLED component, the via hole penetrating the encapsulation film; a distance between the base substrate and a surface of the protrusion away from the base substrate is greater than or equal to a distance between the base substrate and a surface of an organic encapsulation layer farthest from the base substrate in the encapsulation film that is away from the base substrate, and the distance between the base substrate and the surface of the protrusion away from the base substrate is less than a distance between the base substrate and a surface of the encapsulation film away from the base substrate.

In an embodiment of the present disclosure, the via hole includes a first sub-hole and a second sub-hole that are communicated with each other, the first sub-hole penetrates the circuit structure layer, the second sub-hole penetrates the base substrate, and an orthographic projection of the first sub-hole on the base substrate is greater than an orthographic projection of the second sub-hole on the base substrate.

On the other aspect, embodiment of the present disclosure further provides a manufacturing method of a flexible display panel, including: forming a base substrate; forming a circuit structure layer on an upper surface of the base substrate and forming a via hole penetrating the circuit structure layer; and providing a protrusion in an annular shape on an upper surface of the circuit structure layer so that the protrusion surrounds the via hole.

In an embodiment of the present disclosure, forming the circuit structure layer and forming the via hole penetrating the circuit structure layer include: forming a buffer layer on the upper surface of the base substrate; forming one of an active layer and a gate electrode on a surface of the buffer layer away from the base substrate, so that an orthographic projection of the active layer adjacent to the via hole on the base substrate is not overlapped with an orthographic projection of the via hole on the base substrate; forming a first gate insulation layer on the surface of the buffer layer away from the base substrate, so that the first gate insulation layer covers the active layer or the gate electrode; forming the other of the active layer and the gate electrode on a surface of the first gate insulation layer away from the base substrate; forming a second gate insulation layer on the surface of the first gate insulation layer away from the base substrate, so that the second gate insulation layer covers the gate electrode or the active layer; forming a first conductive wire layer on a surface of the second gate insulation layer away from the base substrate; forming an interlayer dielectric layer on a surface of the second gate insulation layer away from the base substrate, so that the interlayer dielectric layer covers the first conductive wire layer; performing a first etching process on the buffer layer, the first gate insulation layer, the second gate insulation layer, and the interlayer dielectric layer to form a first sub-hole and meanwhile removing a portion of the buffer layer, a portion of the first gate insulation layer, a portion of the second gate insulation layer, and a portion of the interlayer dielectric layer that are located in a bending region of the flexible display panel, the first sub-hole constituting the via hole; forming a flexible filling layer at a side of the interlayer dielectric layer away from the base substrate, so that an orthographic projection of the protrusion on the base substrate covers an orthographic projection of the flexible filling layer on the base substrate; forming a source electrode and a drain electrode on a surface of the interlayer dielectric layer away from the base substrate; forming a first planarization layer on the surface of the interlayer dielectric layer away from the base substrate, so that the first planarization layer covers the source electrode and the drain electrode; removing a portion of the first planarization layer located on a bottom wall and a sidewall of the via hole; forming a pixel defining layer on a surface of the first planarization layer away from the base substrate, so that the flexible filling layer is between the interlayer dielectric layer and the pixel defining layer, and an orthographic projection of the flexible filling layer on the base substrate covers an orthographic projection of the pixel defining layer on the base substrate; and forming a spacer layer on a surface of the pixel defining layer away from the base substrate.

In an embodiment of the present disclosure, the method further includes: forming a passivation layer on a surface of the first planarization layer close to the base substrate, and removing a portion of the passivation layer located on the bottom wall and the sidewall of the via hole; forming a second conductive wire layer on a surface of the first planarization layer away from the base substrate; forming a second planarization layer on a surface of the first planarization layer away from the base substrate, so that the second planarization layer covers the second conductive wire layer; removing a portion of the second planarization layer located on the bottom wall and the sidewall of the via hole.

In an embodiment of the present disclosure, forming the circuit structure layer further includes: forming a metal layer, so that an orthographic projection of the protrusion on the base substrate covers an orthographic projection of the metal layer on the base substrate; forming the metal layer includes at least one selected from the group consisting of: forming a first metal layer by a same patterning process as the source electrode; forming a second metal layer by a same patterning process as the gate electrode; forming a third metal layer by a same patterning process as the first conductive wire layer; forming a fourth metal layer by a same patterning process as the second conductive wire layer; and forming a fifth metal layer by a same patterning process as an anode of an organic light-emitting diode (OLED) component.

In an embodiment of the present disclosure, the via hole includes a first sub-hole and a second sub-hole that are communicated with each other, the second sub-hole penetrates the base substrate; the base substrate is formed by any of the following (1) to (8):

(1)

forming a first flexible layer;

forming a first barrier layer on a surface of the first flexible layer close to the circuit structure layer, performing a second etching process on the first barrier layer to form a second space and meanwhile removing a portion of the first barrier layer located in the bending region, the second space constituting the second sub-hole, (2)

forming the first flexible layer, and performing a third etching process on the first flexible layer to form a third space;

forming the first barrier layer on a surface of the first flexible layer close to the circuit structure layer, performing the second etching process on the first barrier layer to form the second space and meanwhile removing a portion of the first barrier layer located in the bending region, both the second space and the third space constituting the second sub-hole, (3)

forming the first flexible layer;

forming the first barrier layer on a surface of the first flexible layer close to the circuit structure layer;

forming an amorphous silicon layer on a surface of the first barrier layer close to the circuit structure, performing a fourth etching process on the amorphous silicon layer and the first barrier layer to form a fourth space and meanwhile removing a portion of the first barrier layer and a portion of the amorphous silicon layer that are located in the bending region, the fourth space constituting the second sub-hole, (4)

forming the first flexible layer, and performing the third etching process on the first flexible layer to form the third space;

forming the first barrier layer on a surface of the first flexible layer close to the circuit structure layer; and forming the amorphous silicon layer on a surface of the first barrier layer close to the circuit structure layer, performing the fourth etching process on the amorphous silicon layer and the first barrier layer to form the fourth space and meanwhile removing a portion of the first barrier layer and a portion of the amorphous silicon layer that are located in the bending region, both the third space and the fourth space constituting the second sub-hole, (5)

forming the first flexible layer;

forming the first barrier layer on a surface of the first flexible layer close to the circuit structure layer;

forming the amorphous silicon layer on a surface of the first barrier layer close to the circuit structure, performing the fourth etching process on the amorphous silicon layer and the first barrier layer to form the a fourth space and meanwhile removing a portion of the first barrier layer and a portion of the amorphous silicon layer that are located in the bending region;

forming a second flexible layer on a surface of the amorphous silicon layer close to the circuit structure layer;

forming a second barrier layer on a surface of the second flexible layer close to the circuit structure layer, performing a fifth etching process on the second barrier layer to form a fifth space and meanwhile removing a portion of the second barrier layer located in the bending region, both the fourth space and the fifth space constituting the second sub-hole, (6)

forming the first flexible layer, and performing the third etching process on the first flexible layer to form the third space;

forming the first barrier layer on a surface of the first flexible layer close to the circuit structure layer;

forming the amorphous silicon layer on a surface of the first barrier layer close to the circuit structure layer, performing the fourth etching process on the amorphous silicon layer and the first barrier layer to form the fourth space and meanwhile removing a portion of the first barrier layer and a portion of the amorphous silicon layer that are located in the bending region;

forming a second flexible layer on a surface of the amorphous silicon layer close to the circuit structure layer;

forming a second barrier layer on a surface of the second flexible layer close to the circuit structure layer, performing the fifth etching process on the second barrier layer to form the fifth space and meanwhile removing a portion of the second barrier layer located in the bending region, all of the third space, the fourth space and the fifth space constituting the second sub-hole, (7)

forming the first flexible layer;

forming the first barrier layer on a surface of the first flexible layer close to the circuit structure layer;

forming the amorphous silicon layer on a surface of the first barrier layer close to the circuit structure layer;

forming the second flexible layer on a surface of the amorphous silicon layer close to the circuit structure layer, and performing a sixth etching process on the second flexible layer to form a sixth space;

forming the second barrier layer on a surface of the second flexible layer close to the circuit structure layer, performing a seventh etching process on the first barrier layer, the amorphous silicon layer, and the second barrier layer to form a seventh space and meanwhile removing a portion of the first barrier layer, a portion of the amorphous silicon layer, and a portion of the second barrier layer that are located in the bending region, both the sixth space and the seventh space constituting the second sub-hole, (8)

forming the first flexible layer, and performing the third etching process on the first flexible layer to form the third space;

forming the first barrier layer on a surface of the first flexible layer close to the circuit structure layer;

forming the amorphous silicon layer on a surface of the first barrier layer close to the circuit structure layer;

forming the second flexible layer on a surface of the amorphous silicon layer close to the circuit structure layer, and performing the sixth etching on the second flexible layer to form the sixth space;

forming the second barrier layer on a surface of the second flexible layer close to the circuit structure layer, performing the seventh etching process on the first barrier layer, the amorphous silicon layer, and the second barrier layer to form the seventh space and meanwhile removing a portion of the first barrier layer, a portion of the amorphous silicon layer, and a portion of the second barrier layer that are located in the bending region, all of the third space, the sixth space, and the seventh space constituting the second sub-hole.

In an embodiment of the present disclosure, an orthographic projection of the first sub-hole on the base substrate is greater than an orthographic projection of the second sub-hole on the base substrate.

In an embodiment of the present disclosure, the method further includes forming an encapsulation film configured to encapsulate the OLED component; forming the encapsulation film configured to encapsulate the OLED component includes: forming a plurality of inorganic encapsulation layers and a plurality of organic encapsulation layers that are alternately arranged on a surface of the OLED component away from the base substrate; the plurality of inorganic encapsulation layers are formed at a position which is around the protrusion and away from the via hole by an inkjet printing process; a distance between the base substrate and a surface of the protrusion away from the base substrate is greater than or equal to a distance between the base substrate and a surface of an organic encapsulation layer farthest from the base substrate in the organic encapsulation film that is away from the base substrate, and a distance between the base substrate and the surface of the protrusion away from the base substrate is less than a distance between the base substrate and a surface of the encapsulation film away from the base substrate.

In an embodiment of the present disclosure, forming the inorganic encapsulation layer includes: forming an inorganic layer at a side of the OLED component away from the base substrate; removing a portion of the inorganic layer in the via hole by an etching process to obtain the inorganic encapsulation layer; an organic layer in the OLED component and the inorganic encapsulation layer closest to the OLED component are formed by an etching process, the organic layer is at least one selected from the group consisting of a hole injection layer, a hole transport layer, an electron transport layer, and an electron injection layer in the OLED component.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

DETAILED DESCRIPTION

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but can include an electrical connection, directly or indirectly. "On," "under," "right," "left" and the like are only used to indicate relative position relationship, and when the position of the described object is changed, the relative position relationship can be changed accordingly.

The inventor(s) of the present application found in research that when an organic encapsulation layer in an encapsulation film is formed by inkjet printing, an organic liquid for forming an organic encapsulation layer may fall into a via hole and form an undesired organic encapsulation layer, resulting in the need of etching and removing a portion of the organic encapsulate layer which is erroneously formed in the via hole and usually has a large thickness, thereby greatly increasing a process flow and a process time. In addition, during manufacturing the via hole, an etchant is susceptible to damage a light-emitting material of an OLED component adjacent to the via hole.

Figure 1A:
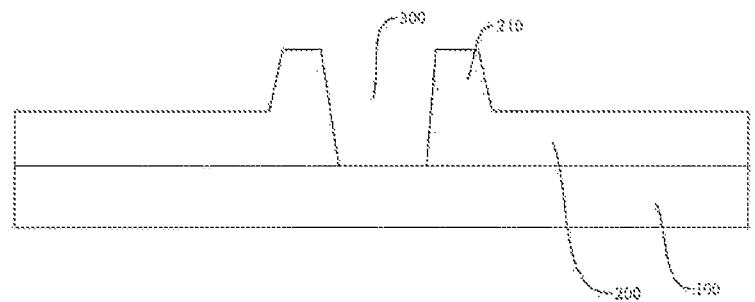
FIG. 1A-FIG. 1B are schematic structural views illustrating a flexible display panel provided by an embodiment of the present disclosure.
Figure 1B:
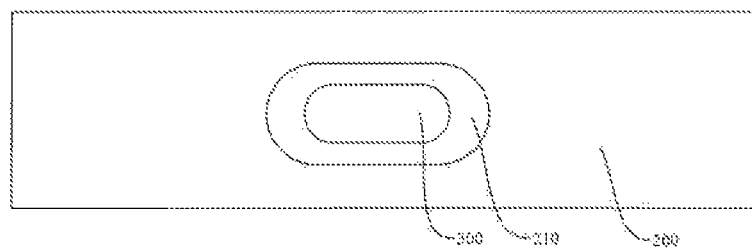

An embodiment of the present disclosure provides a flexible display panel, as illustrated in FIG. 1A and FIG. 1B. FIG. 1A is a cross-sectional view illustrating a flexible display panel provided by an embodiment of the present disclosure, and FIG. 1B is a top view illustrating the flexible display panel. Referring to FIG. 1A-FIG. 1B, the flexible display panel may include: a base substrate 100, a circuit structure layer 200 and a via hole 300; the circuit structure layer 200 is located on an upper surface of the base substrate 100, and a protrusion 210 in an annular shape is provided at a side of the circuit structure layer 200 away from the base substrate 100; the via hole 300 penetrates the circuit structure layer 200; an orthographic projection S1 of the protrusion 210 on the base substrate 100 covers an orthographic projection S2 of the via hole 300 on the base substrate 100, and the protrusion 210 surrounds the via hole 300.

According to the embodiment of the present disclosure, an arrangement of the protrusion can prevent an organic liquid from falling into the via hole, so that an organic encapsulation material would not be formed in the via hole any more, and a process for removing the organic encapsulation material in the via hole is omitted, thereby shortening the process flow and the process time. Moreover, the arrangement of the protrusion can also prevent the etchant from damaging the light-emitting material of the OLED component adjacent to the via hole, and can effectively protect the light-emitting material adjacent to the via hole against water and oxygen, thereby mitigating an occurrence of photon overflow, reducing an efficiency of non-radiative recombination, and improving a light-emitting efficiency of the flexible display panel. In addition, the arrangement of the protrusions can optimize a film structure of the base substrate.

It should be explained that "the protrusion in an annular shape is provided at the side of the circuit structure layer away from the base substrate" in the present disclosure may refer to that the circuit structure layer includes the protrusion; that is, the protrusion is a part of the circuit structure layer.

A shape of the via hole is not particularly limited in the embodiment of the present disclosure, and can be flexibly selected according to actual needs by those skilled in the art. For example, the via hole may be in a shape of a circle or an ellipse, and may also be in a shape of a rectangle spliced with circular arcs arranged on opposite sides of the rectangle (see FIG. 1B). As a result, the shape of the via hole can be flexibly designed to meet different market needs.

Figure 2A:
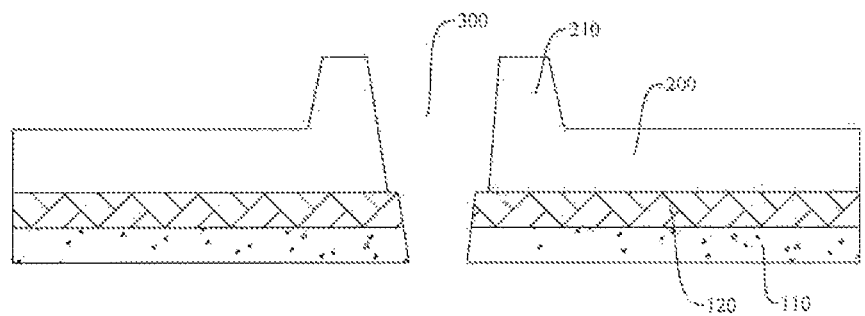
FIG. 2A-FIG. 2B are schematic structural views illustrating a flexible display panel provided by another embodiment of the present disclosure.
Figure 2B:
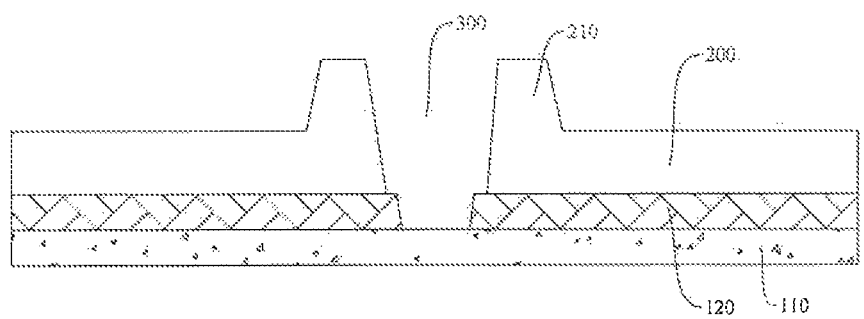

According to an embodiment of the present disclosure, in order to optimize a film layer structure of the base substrate, referring to FIG. 2A-FIG. 2B, the base substrate 100 may include a first flexible layer 110 and a first barrier layer 120, and the first barrier layer 120 is located between the first flexible layer 110 and the circuit structure layer 200. In some embodiments of the present disclosure, referring to FIG. 2A, the via hole 300 penetrates the first barrier layer 120 and the first flexible layer 110, so that a light transmittance of the via hole can be improved, thereby improving a service performance of an optical sensor such as a camera placed in the via hole. In other embodiments of the present disclosure, referring to FIG. 2B, because a material for forming the first flexible layer is generally a transparent flexible material (such as polyimide (PI))) having a higher light transmittance and has less influence on the optical sensor such as the camera placed in the via hole, the via hole 300 may penetrate only the first barrier layer 120 without penetrating the first flexible layer 110, that is, a portion of the first flexible layer 110 corresponding to the via hole 300 is not etched away. As a result, one etching process can be omitted, which not only shortens the process flow and the process time but also saves the cost.

Figure 3A:
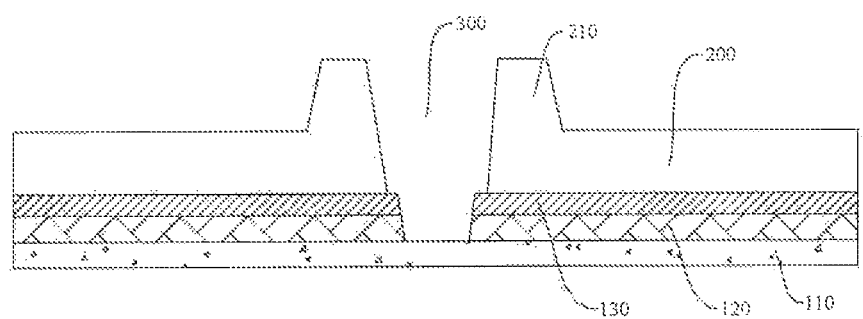
FIG. 3A-FIG. 3B are schematic structural views illustrating a flexible display panel provided by still another embodiment of the present disclosure.
Figure 3B:
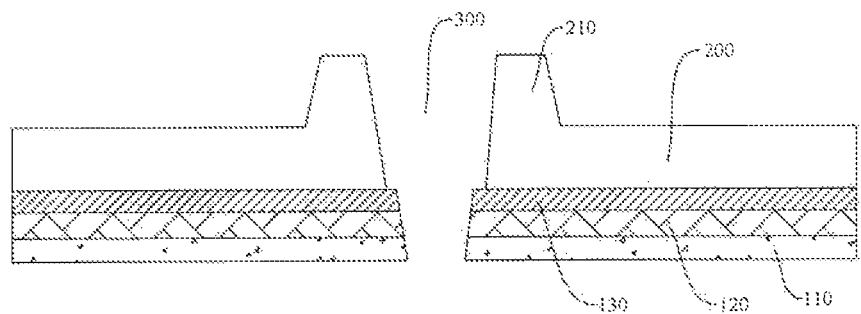

According to an embodiment of the present disclosure, in order to block laser energy from penetrating into an upper film layer during a subsequent laser lift-off (LLO) process (stripping process), referring to FIG. 3A and FIG. 3B, the base substrate 100 may further include an amorphous silicon layer 130, and the amorphous silicon layer 130 is located on a surface of the first barrier layer 120 close to the circuit structure layer 200. In some embodiments of the present disclosure, referring to FIG. 3A, the via hole 300 penetrates the first barrier layer 120 and the amorphous silicon layer 130 without penetrating the first flexible layer 110, that is, a portion of the first flexible layer 110 corresponding to the via hole 300 is not etched away. In other embodiments of the present disclosure, referring to FIG. 3B, the via hole 300 penetrates the first barrier layer 120, the amorphous silicon layer 130, and the first flexible layer 110. As a result, an arrangement of the amorphous silicon layer can not only block an upward permeation of energy toward an upper film layer during laser stripping so as to prevent the energy from influencing a performance of the upper film layer, but also improve a surface adhesion by hydrogen atoms in the amorphous silicon layer so as to improve an adhesion of the amorphous silicon layer with a structure adjacent thereto.

Figure 4A:
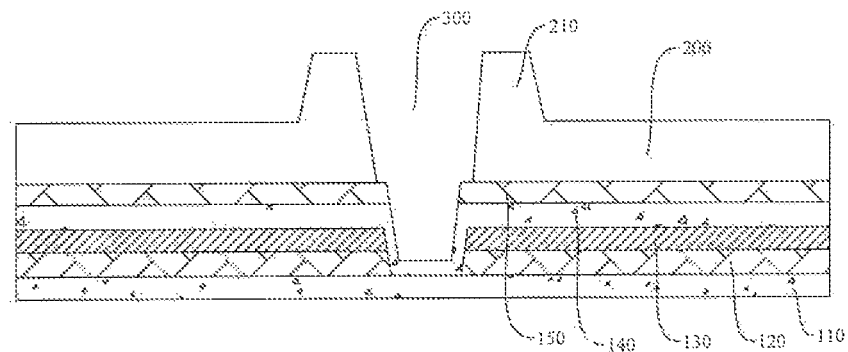
FIG. 4A-FIG. 4B are schematic structural views illustrating a flexible display panel provided by still another embodiment of the present disclosure.
Figure 4B:
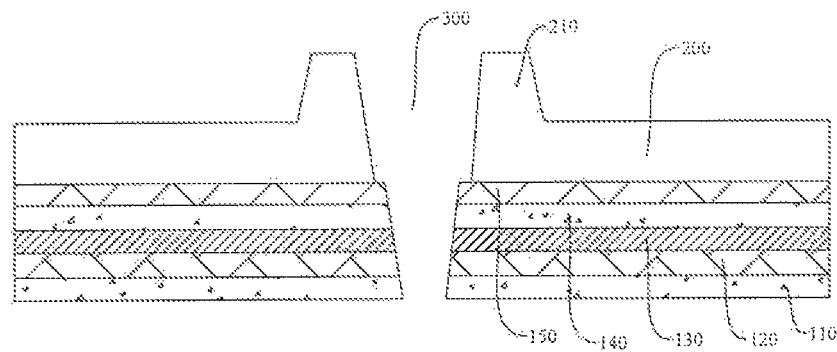

According to an embodiment of the present disclosure, in order to further optimize the film layer structure of the base substrate, referring to FIG. 4A-FIG. 4B, the base substrate 100 may further include: a second flexible layer 140 located on a surface of the amorphous silicon layer 130 close to the circuit structure layer 200, and a second barrier layer 150 located on a surface of the second flexible layer 140 close to the circuit structure layer 200. In some embodiments of the present disclosure, referring to FIG. 4A, the via hole 300 penetrates the amorphous silicon layer 130, the second barrier layer 150 and the first barrier layer 120, without penetrating the first flexible layer 110 and the second flexible layer 140. That is, a portion of the first flexible layer 110 corresponding to the via hole 300 and a portion of the second flexible layer 140 corresponding to the via hole 300 are not etched away. In other embodiments of the present disclosure, referring to FIG. 4B, the via hole 300 penetrates the amorphous silicon layer 130, the first barrier layer 120, the second barrier layer 150, and at least one of the second flexible layer 140 and the first flexible layer 110. It is to be explained that, FIG. 4B only illustrates the case where the via hole 300 penetrates both the first flexible layer 110 and the second flexible layer 140, by way of example. The case where the via hole 300 penetrates one of the first flexible layer 110 and the second flexible layer 140 is not illustrated in the drawings. When the flexible display panel is stripped off from a glass substrate in a subsequent process, the first flexible layer is easily to be torn, and static electricity is also generated in the stripping process. An arrangement of the second flexible layer can overcome this drawback. The second flexible layer can not only replace the first flexible layer as a flexible substrate to ensure the service performance of the flexible display panel, but also play a role of insulation so as to be anti-static, that is, to prevent static electricity from producing adverse effect to other film layers (especially conductive layers). Moreover, the second flexible layer can further ensure good bending performance of the flexible display panel. Furthermore, the arrangement of the second barrier layer can further ensure good characteristics of the flexible display panel.

According to an embodiment of the present disclosure, in the case where the via hole does not penetrate at least one of the first flexible layer and the second flexible layer and the via hole is used to place an optical sensor such as a camera, in order to compensate an influence of the first flexible layer and/or the second flexible layer on a light transmittance, the influence of the first flexible layer and/or the second flexible layer on the light transmittance may be pre-detected. That is, the compensating process includes: determining a design parameter of the first flexible layer and/or the second flexible layer (such as a thickness, a light transmittance, etc. of the film layer), and then obtaining a compensation factor through obtaining a corresponding parameter of an optical instrument (such as CCD) by calculating, and then calibrating the optical sensor such as the camera according to the compensation factor.

According to an embodiment of the present disclosure, the via hole is suitable for placing a component such as a camera, an earpiece, a fingerprint recognizer, or a physical button, and a person skilled in the art can flexibly select a position of the via hole according to an overall design requirement of the display device using the flexible display panel. For example, the via hole may be located at a corner position of the flexible display panel, or at an intermediate position of an edge of the flexible display panel.

A material for forming the first barrier layer and a material for forming the second barrier layer are not particularly limited in the embodiment of the present disclosure, and can be flexibly selected by those skilled in the art according to actual needs. For example, the materials for forming the first barrier layer and the second barrier layer include, but are not limited to, metals such as silver, copper, aluminum, molybdenum, or alloy materials formed by at least one of the above metals.

Figure 5:
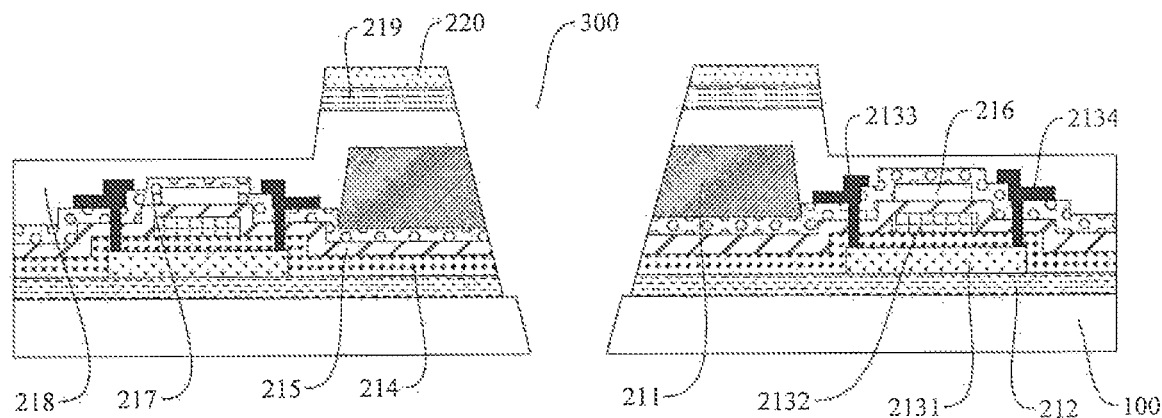
FIG. 5 is a schematic structural view illustrating a flexible display panel provided by still another embodiment of the present disclosure.

According to an embodiment of the present disclosure, in order to obtain a protrusion having a predetermined height, referring to FIG. 5, the circuit structure layer 200 may include a flexible filling layer 211, and an orthographic projection of the protrusion 210 on the base substrate 100 covers an orthographic projection of the flexible filling layer 211 on the base substrate 100. The flexible filling layer is thick, and it is possible to effectively obtain a protrusion of a suitable height. In an embodiment of the present disclosure, a material for forming the flexible filling layer may be polyimide.

According to an embodiment of the present disclosure, referring to FIG. 5, the circuit structure layer 200 may include: a buffer layer 212 located on an upper surface of the base substrate 100; a thin film transistor which is located at a side of the buffer layer 212 away from the base substrate 100 and includes an active layer 2131, a gate electrode 2132, a source electrode 2133 and a drain electrode 2134; a first gate insulation layer 214 located between the active layer 2131 and the gate electrode 2132; a second gate insulation layer 215 which is located on a surface of the first gate insulation layer 214 away from the base substrate 100 and covers the gate electrode 2132 (for the case where the thin film transistor is of a bottom gate electrode structure, not illustrated in the drawing) or covers the active layer 2131 (for the case where the thin film transistor is of a top gate electrode structure, as illustrated in FIG. 5); a first conductive wire layer 216 located on a surface of the second gate insulation layer 215 away from the base substrate 100; an interlayer dielectric layer 217 which is located on the surface of the second gate insulation layer 215 away from the base substrate 100 and covers the first conductive wire layer 216; the source electrode 2133 and the drain electrode 2134 of the thin film transistor are located on a surface of the interlayer dielectric layer 217 away from the base substrate 100, and are electrically connected to the active layer through via holes, respectively; a first planarization layer 218 which is located on a surface of the interlayer dielectric layer 217 away from the base substrate 100 and covers the source electrode and the drain electrode; a pixel defining layer 219 located on a surface of the first planarization layer 218 away from the base substrate 100; and a spacer layer 220 located on a surface of the pixel defining layer 219 away from the base substrate 100. The flexible filling layer 211 is located between the interlayer dielectric layer 217 and the pixel defining layer 219. In addition, it can be seen from the above arrangement that the pixel defining layer and the spacer layer can further increase a height of the protrusion as a supporter.

In order to reduce a border (bezel) of the flexible display panel, a bending region is usually formed at a position where the bezel is located after the interlayer dielectric layer 217 is formed; furthermore, in order to prevent from cracking of the bending region, a part of a layer structure in the bending region is etched away to thin the bending region and fill the flexible region with a flexible material. In some embodiments of the present disclosure, the flexible filling layer may be formed of a flexible material which is the same as the flexible material filled in the bending region, by using a synchronous patterning process; that is, the flexible filling layer 211 is located on the surface of the interlayer dielectric layer 217 away from the base substrate 100 (as illustrated in FIG. 5), which can shorten the process flow.

According to an embodiment of the present disclosure, in order to prevent the formation of via hole from affecting the thin film transistor, as illustrated in FIG. 5, an orthographic projection of the thin film transistor adjacent to the via hole on the base substrate and an orthographic projection of the via hole on the base substrate are not overlapped with each other. During the formation of the via hole, multiple etching processes are required. The above arrangement can effectively ensure that multiple etching processes do not affect the thin film transistor. It should be explained that the thin film transistor mentioned in the present disclosure only includes an active layer, a gate electrode, a source electrode, and a drain electrode, and does not include an insulation layer structure such as a first gate insulation layer, a second gate insulation layer, or the like.

Figure 6:
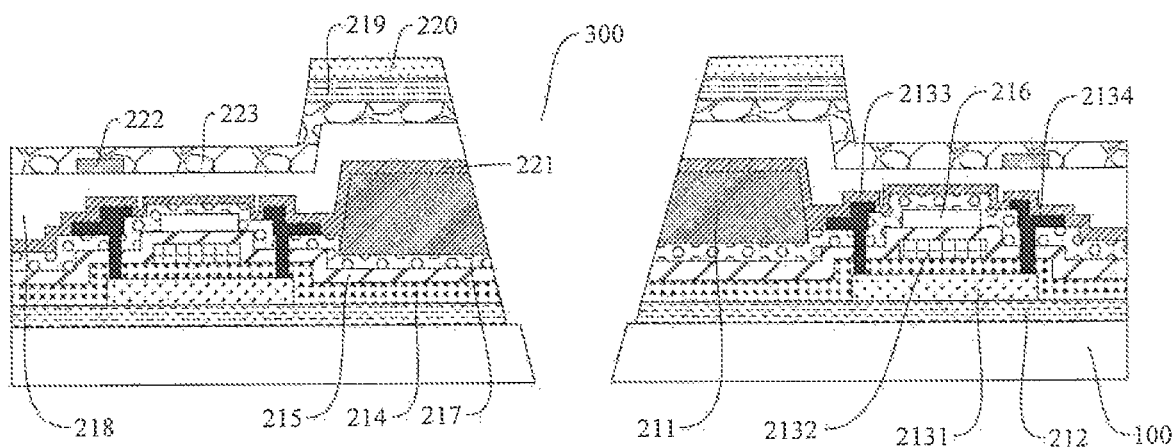
FIG. 6 is a schematic structural view illustrating a flexible display panel provided by still another embodiment of the present disclosure.

According to an embodiment of the present disclosure, referring to FIG. 6, the circuit structure layer may further include: a passivation layer 221 located on a surface of the first planarization layer 218 close to the base substrate 100; a second conductive wire layer 222 located on the surface of the first planarization layer 218 away from the base substrate 100; and a second planarization layer 223 which is located on the surface of the first planarization layer 218 away from the base substrate 100 and covers the second conductive wire layer 222. As a result, the first conductive wire layer and the second conductive wire layer constitute a structure of the flexible display panel such as a signal wiring, an electrode plate of a capacitor, an electrode and the like, thereby further improving the performance of the flexible display panel.

According to an embodiment of the present disclosure, a material for forming the buffer layer, the first gate insulation layer, the second gate insulation layer, the interlayer dielectric layer, the first planarization layer, the passivation layer, the second planarization layer, and the pixel defining layer includes, but is not limited to, an inorganic material such as silicon nitride, silicon oxide, silicon oxynitride, or an organic insulation material; a material for forming the spacer layer includes, but is not limited to polyimide (PI) adhesive, for example, an auxiliary agent may also be added in the polyimide to improve the performance of the spacer layer such as the strength and the like; a material for forming the active layer includes, but is not limited to, amorphous silicon, indium gallium zinc oxide, indium zinc tin oxide, etc.; a material for forming the gate electrode, the drain electrode, the source electrode, the first conductive wire layer and the second conductive wire layer includes, but is not limited to, a metal such as silver, copper, aluminum and molybdenum, or an alloy formed by one of the above metals, or an conductive oxide such as indium tin oxide. For further example, the first conductive wire layer and the gate electrode may be formed of the same material, and the second conductive wire layer, the source electrode and the drain electrode may be formed of the same material. Those skilled in the art should understand that the first conductive wire layer and the second conductive wire layer constitute a structure of the flexible display panel such as a signal wiring, an electrode plate of a capacitor, an electrode and the like.

Figure 7A:
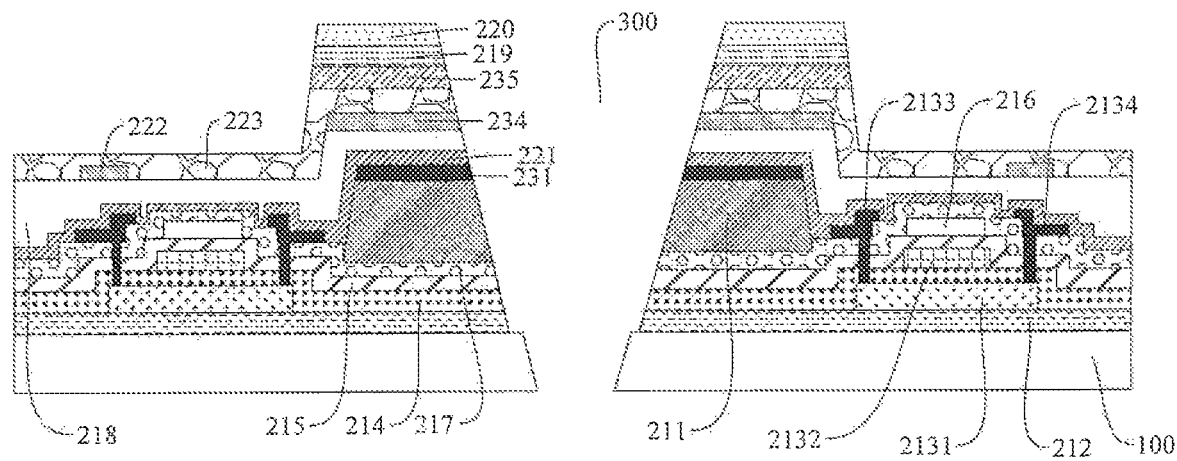
FIG. 7A-FIG. 7B are schematic structural views illustrating a flexible display panel provided by still another embodiment.
Figure 7B:
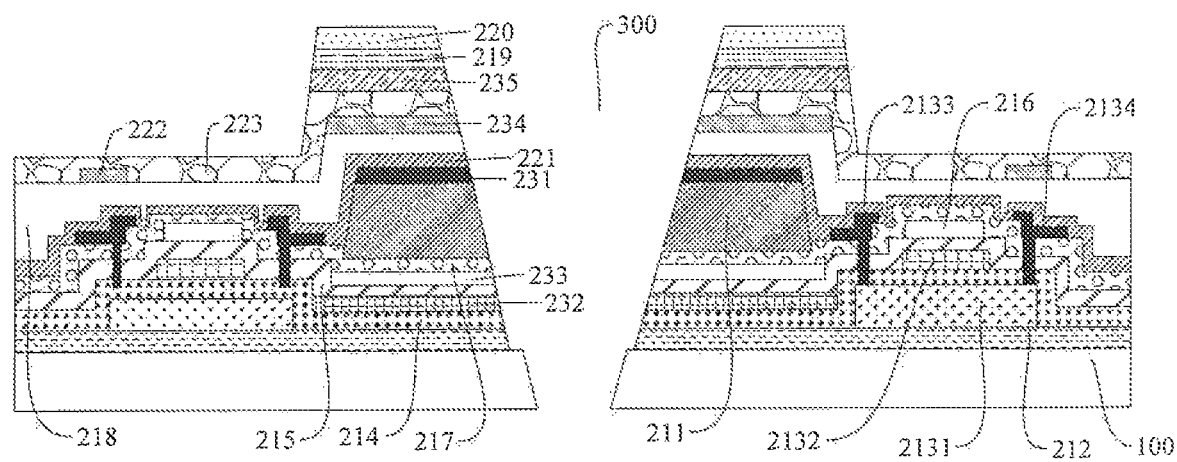

According to an embodiment of the present disclosure, in order to enhance the strength of the protrusion, referring to FIG. 7A-FIG. 7B, the protrusion further includes a metal layer, and an orthographic projection of the protrusion on the base substrate completely covers an orthographic projection of the metal layer on the base substrate. The metal layer may be selected from at least one of the following: a first metal layer 231 formed by the same patterning process as the source electrode 2133; the second metal layer 232 formed by the same patterning process as the gate electrode 2132; a third metal layer 233 formed by the same patterning process as the first conductive wire layer 216; a fourth metal layer 234 formed by the same patterning process as the second conductive wire layer 222; a fifth metal layer 235 formed by the same patterning process as an anode (not illustrated) of the OLED component. FIG. 7A illustrates an embodiment in which the metal layer includes the first metal layer, the fourth metal layer, and the fifth metal layer, and FIG. 7B illustrates an embodiment in which the metal layer includes the first metal layer to the fifth metal layer. As a result, an arrangement of the metal layer can effectively enhance the strength of the protrusion and improve the stability of the flexible display panel. It should be explained that, in order not to affect the performance of the flexible display panel, the above metal layers are not electrically connected to any of the conductive wire, the electrode, the source electrode, the drain electrode, the gate electrode, and the like in the flexible display panel. For example, the first metal layer and the source electrode are formed by the same patterning process, which refers to that, a patterned first metal layer and a patterned source electrode are obtained by etching a same metal layer in a same patterning process, but the first metal layer is not electrically connected with the source electrode. The electrical connection relationship is also the same for the second metal layer to the fifth metal layer, but in order to prevent the conductivity of each of the metal layers from affecting the flexible display panel, the above metal layers may be grounded.

It should be explained that those skilled in the art can understand that the OLED component is located on a surface of the second planarization layer 223 away from the base substrate 100, is around the protrusion and away from the via hole. For example, as illustrated in FIG. 5, in the case where the flexible display panel is not provided with the passivation layer 221, the second conductive wire layer 222, and the second planarization layer 223, the OLED component is located on the surface of the first planarization layer 218 away from the base substrate 100. The OLED component may be a conventional OLED component. For example, the OLED component may include an anode, a hole injection layer, a hole transport layer, a light-emitting layer, an electron transport layer, an electron injection layer, and cathode, which are sequentially located at a side of the second planarization layer 223 away from the base substrate.

Figure 8:
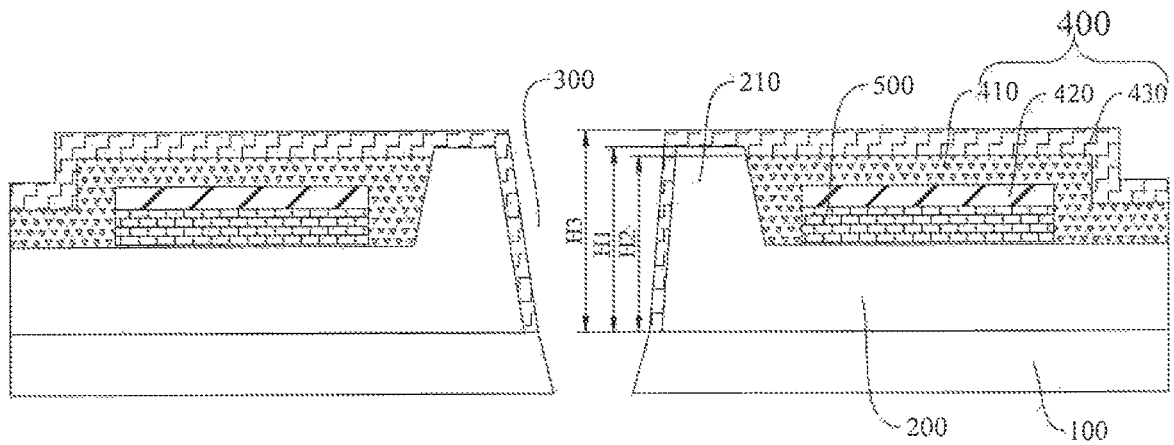
FIG. 8 is a schematic structural view illustrating a flexible display panel provided by still another embodiment of the present disclosure.

According to an embodiment of the present disclosure, the flexible display panel may further include an encapsulation film 400 configured to encapsulate the OLED component 500, and the via hole penetrates the encapsulation film. As described above, the arrangement of the protrusion 210 can prevent the organic liquid for forming the organic encapsulation layer 410 in the encapsulation film 400 from falling into the via hole. Therefore, as illustrated in FIG. 8, a distance H1 between the base substrate 100 and a surface of the protrusion 210 away from the base substrate 100 is greater than or equal to a distance H2 between the base substrate 100 and a surface of an organic encapsulation layer 410 farthest from the base substrate 100 in the encapsulation film 400 that is away from the base substrate 100, and the distance H1 between the base substrate 100 and the surface of the protrusion 210 away from the base substrate 100 is smaller than a distance H3 between the base substrate 100 and a surface of the encapsulation film 400 away from the base substrate 100. Therefore, it is possible to effectively ensure that an organic liquid does not fall into the via hole during the process of forming the organic encapsulation layer.

A structure of the encapsulation film is not particularly limited in the embodiments of the present disclosure, and can be flexibly selected by those skilled in the art according to actual needs. In some embodiments of the present disclosure, as illustrated in FIG. 8, the encapsulation film may include a first inorganic encapsulation layer 420, an organic encapsulation layer 410, and a second inorganic encapsulation layer 430 which are sequentially stacked, which may ensure that a distance H1 between the base substrate 100 and a surface of the protrusion 210 away from the base substrate 100 is greater than or equal to a distance H2 between the base substrate 100 and a surface of the organic encapsulation layer 410 away from the base substrate 100, and ensure that the distance H1 between the base substrate 100 and the surface of the protrusion 210 away from the base substrate 100 is smaller than a distance H3 between the base substrate 100 and a surface of the second inorganic encapsulation layer 430 away from the base substrate 100. In other embodiments of the present disclosure, the encapsulation film may further include a plurality of inorganic encapsulation layers and a plurality of organic encapsulation layers that are alternately arranged, such as in an arrangement of a first inorganic encapsulation layer, a first organic encapsulation layer, a second inorganic encapsulation layer, a second organic encapsulation layer, a third inorganic encapsulation layer, a third organic encapsulation layer, and the like that are sequentially arranged.

A material for forming the first inorganic encapsulation layer, a material for forming the organic encapsulation layer, and a material for forming the second inorganic encapsulation layer are not particularly limited in the embodiments of the present disclosure, and can be flexibly selected by those skilled in the art according to actual needs. For example, a material for forming the first inorganic encapsulation layer and material for forming the second inorganic encapsulation layer include, but are not limited to, materials such as silicon nitride, silicon oxide, and silicon oxynitride, and a better encapsulation effect can be achieved by using the above materials. A material for forming the organic encapsulation layer includes, but is not limited to an organic material such as a polymer material, a resin, and an alcohol.

According to an embodiment of the present disclosure, in order to improve the encapsulation effect, an encapsulation layer (such as the second inorganic encapsulation layer 430 as illustrated in FIG. 8) in the encapsulation film farthest from the base substrate may further cover a surface of the protrusion 210 away from the base substrate 100 in addition to covering other encapsulation layers, and may even cover at least a portion of a sidewall of the via hole 300, in this way, a permeation path of water and oxygen to the OLED component can be prolonged, thereby further effectively protecting the OLED component.

According to an embodiment of the present disclosure, in order to facilitate encapsulation of the OLED component, as illustrated in FIG. 1-FIG. 8, the via hole may include a first sub-hole and a second sub-hole that are communicated with each other, the first sub-hole penetrates the circuit structure layer, the second sub-hole penetrates the base substrate, and an orthographic projection of the first sub-hole on the base substrate is greater than an orthographic projection of the second sub-hole on the base substrate, so that the OLED component is facilitated to be encapsulated, and an encapsulation thickness of an edge of the encapsulation film is ensured, thereby improving the encapsulation effect of the OLED component. It should be explained that the "second sub-hole penetrates the base substrate" includes two cases, the first ease is that the second sub-hole penetrates all the film structures in the base substrate, and the second case is that the second sub-hole penetrates all other film structures in the base substrate except the flexible layer (including at least one of the first flexible layer and the second flexible layer). It should be explained that the flexible display panel may not be provided with the second sub-hole, that is, the via hole may include only the first sub-hole, or the via hole 300 is consisted of the first sub-hole.

Another aspect of an embodiment of the present disclosure provides a manufacturing method of a flexible display panel. Referring to FIG. 1, FIG. 10A-FIG. 10D, and FIG. 11A-FIG. 11D, the flexible display panel obtained by the manufacturing method of the present embodiment may include a base substrate 100 and a circuit structure layer 200 formed on a surface of the base substrate. For example, the flexible display panel is provided with a via hole 300, and the via hole 300 includes a first sub-hole 310 and a second sub-hole 320 that are communicated with each other. The first sub-hole 310 penetrates the circuit structure layer 200, and the second sub-hole 320 penetrates the base substrate 100. It should be explained that the flexible display panel may not be provided with the second sub-hole, that is, the via hole only includes the first sub-hole, or the via hole is consisted of the first sub-hole. Furthermore, the "second sub-hole penetrates the base substrate" includes two cases, the first case is that the second sub-hole penetrates all the film structures in the base substrate, and the second case is that the second sub-hole penetrates all other film structures in the base substrate except the flexible layer (including at least one of the first flexible layer and the second flexible layer).

Figure 9:
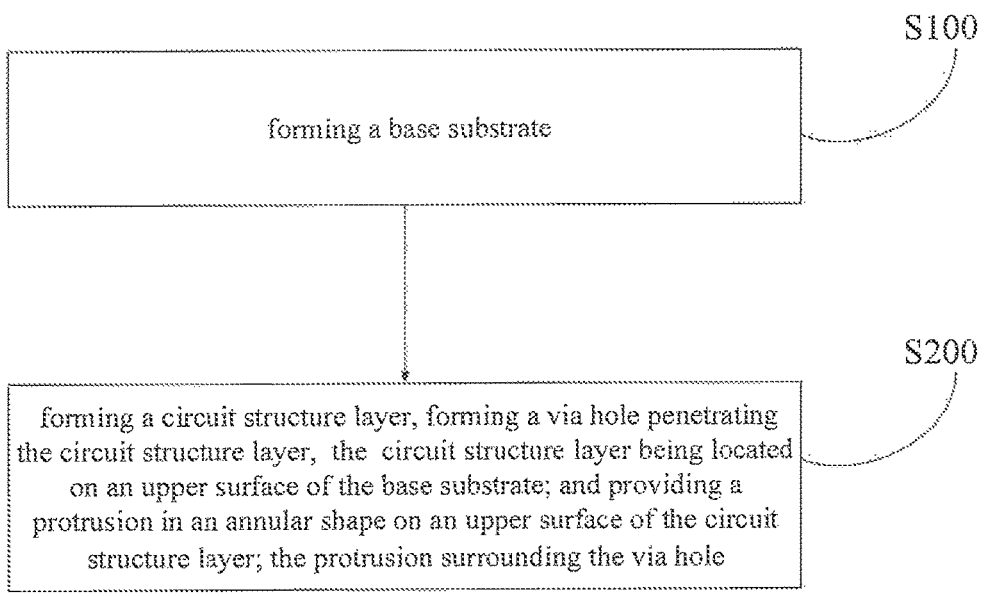
FIG. 9 is a flowchart of a manufacturing method of a flexible display panel provided by still another embodiment of the present disclosure.
Figure 10A:
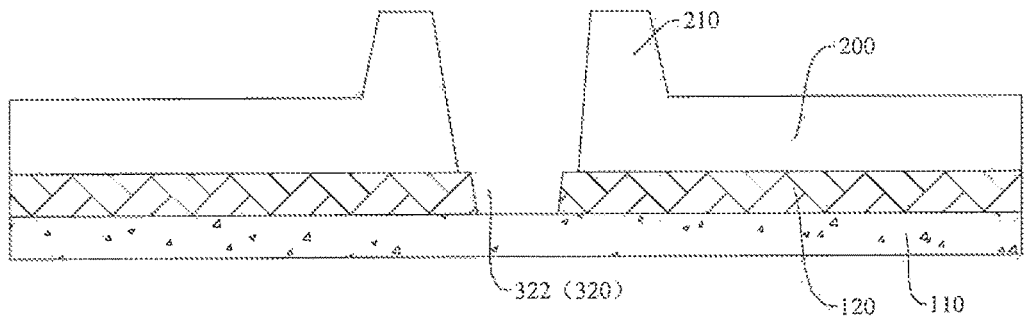
FIG. 10A-FIG. 10D are schematic structural views illustrating a flexible display panel provided by still another embodiment of the present disclosure.
Figure 10B:
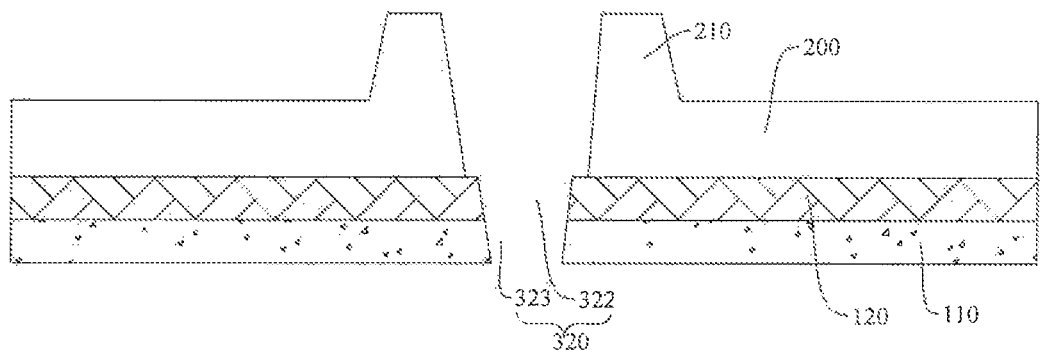
Figure 10C:
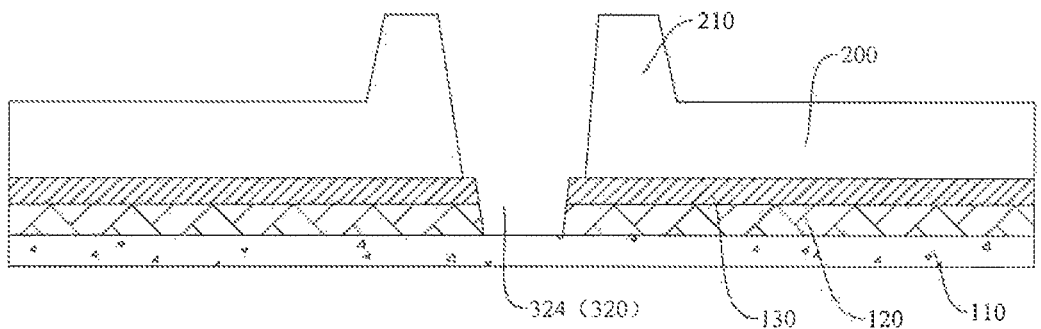
Figure 10D:
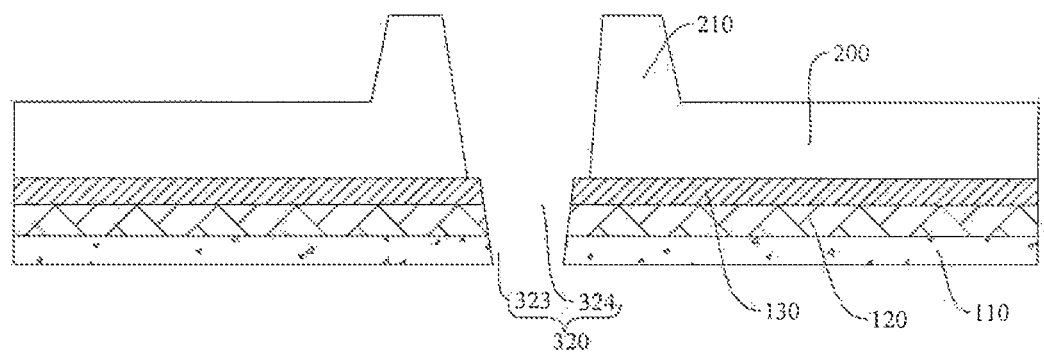

According to an embodiment of the present disclosure, referring to FIG. 9, the manufacturing method of the flexible display panel may include the following steps S100-S200 and their sub-steps.

Step S100, forming a base substrate.

According to an embodiment of the present disclosure, in order to optimize the film layer structure of the base substrate and to improve the service performance of the flexible display panel, the base substrate may be formed, for example, by any one of the following steps (1) to (8).

In some embodiments of the present disclosure, the base substrate is formed by the step (1), which includes: forming a first flexible layer 110; forming a first barrier layer 120 located on a surface of the first flexible layer 110 close to the circuit structure layer 200; and performing a second etching process on the first barrier layer 120 to form a second space 322 and simultaneously removing a portion of the first barrier layer located in the bending region, the second space 322 constitutes a second sub-hole 320. The structure as obtained is referred to FIG. 10A. The above manufacturing method is simple, has mature process, and is easy to be industrially implemented. Because the first flexible layer is not etched, an etching process can be omitted and the process flow can be shortened under the premise of ensuring the light transmittance of the via hole. Moreover, the etching process simultaneously removes a portion of the first barrier layer located in the bending region (not illustrated), which can further reduce one time of etching process and shorten the process flow.

In some embodiments of the present disclosure, the base substrate is formed by the step (2), which includes: forming a first flexible layer 110; performing a third etching process on the first flexible layer 110 to form a third space 323; forming a first barrier layer 120 on a surface of the first flexible layer 110 close to the circuit structure layer 200; performing a second etching process on the first barrier layer 120 to form the second space 322 and simultaneously removing a portion of the first harrier located in the bending region, both the second space 322 and the third space 323 constitute the second sub-hole 320. The structure as obtained is referred to FIG. 10B. In this way, it further improves the light transmittance of the via hole.

In some embodiments of the present disclosure, the base substrate is formed by the step (3), which includes: forming a first flexible layer 110; forming a first barrier layer 120 on a surface of the first flexible layer 110 close to the circuit structure layer 200; forming an amorphous silicon layer 130 on a surface of the first barrier layer 120 close to the circuit structure layer 200; performing a fourth etching process on both the amorphous silicon layer 130 and the first barrier layer 120 to form a fourth space 324 and simultaneously remove a portion of the first barrier layer located in the bending region and a portion of the amorphous silicon layer located in the bending region, the fourth space 324 constitutes the second sub-hole 320. The structure as obtained is referred to FIG. 10C.

In some embodiments of the present disclosure, the base substrate is formed by the step (4), which includes: forming a first flexible layer 110; performing a third etching process on the first flexible layer 110 to form a third space 323; forming a first barrier layer 120 on a surface of the first flexible layer 110 close to the circuit structure layer 200; forming an amorphous silicon layer 130 on a surface of the first barrier layer 120 close to the circuit structure layer 200; performing a fourth etching process on the amorphous silicon layer 130 and the first barrier layer 120 to form a fourth space 324 and simultaneously remove a portion of the first barrier layer and a portion of the amorphous silicon layer that are located at a bending region, and both the third space 323 and the fourth space 324 constitute the second sub-hole 320. The structure as obtained is referred to FIG. 10D. As a result, an arrangement of the amorphous silicon layer can not only block the upward permeation of energy toward an upper film layer during laser stripping so as to prevent the energy from influencing a performance of the upper film layer, but also improve a surface adhesion by hydrogen atoms in the amorphous silicon layer so as to improve an adhesion of the amorphous silicon layer with a structure adjacent thereto.

In some embodiments of the present disclosure, the base substrate is formed by the step (5), which includes: forming a first flexible layer 110; forming a first barrier layer 120 on a surface of the first flexible layer 110 close to the circuit structure layer 200; forming an amorphous silicon layer 130 on a surface of the first barrier layer 120 adjacent to the circuit structure layer 200; performing a fourth etching process on the amorphous silicon layer 130 and the first barrier layer 120 to form a fourth space 324 and simultaneously removing a portion of the first barrier layer and a portion of the amorphous silicon layer that are located at a bending region; forming a second flexible layer 140 on a surface of the amorphous silicon layer 130 close to the circuit structure layer 200; forming a second barrier layer 150 on a surface of the second flexible layer 140 close to the circuit structure layer 200; performing a fifth etching process on the second barrier layer 150 to form a fifth space 325 and simultaneously removing a portion of the second barrier layer located in the bending region, both the fourth space 324 and the fifth space 325 constitute the second sub-hole 320. The structure as obtained is referred to FIG. 11A.

Figure 11A:
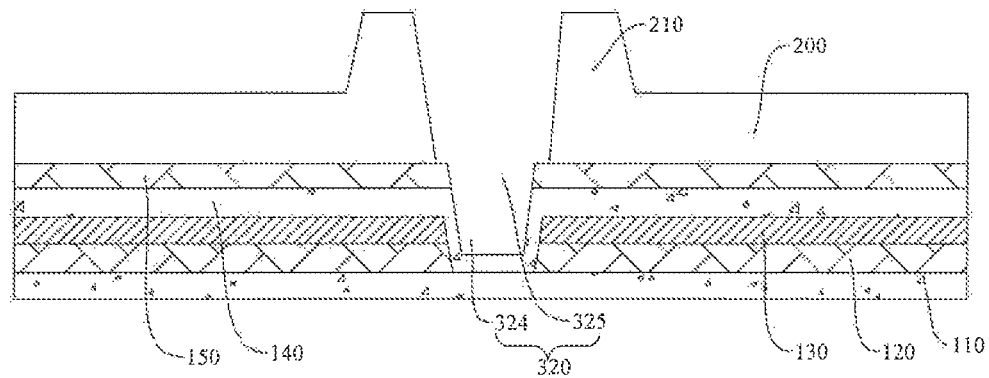
FIG. 11A-FIG. 11D are schematic structural views illustrating a flexible display panel provided by still another embodiment of the present disclosure.
Figure 11B:
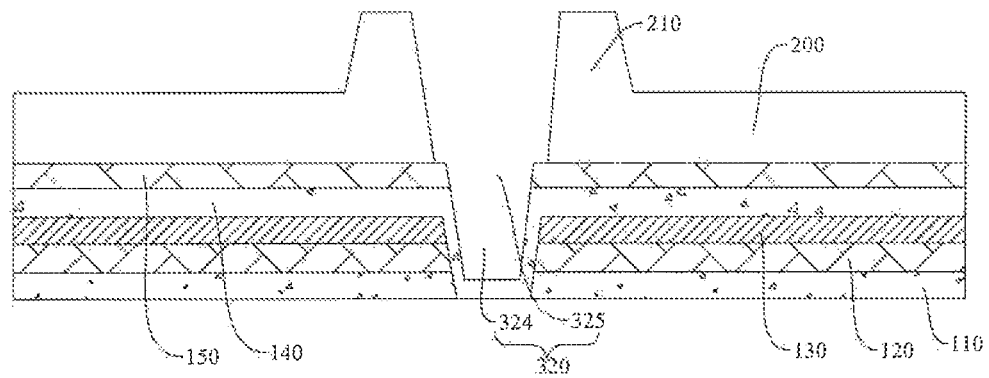
Figure 11C:
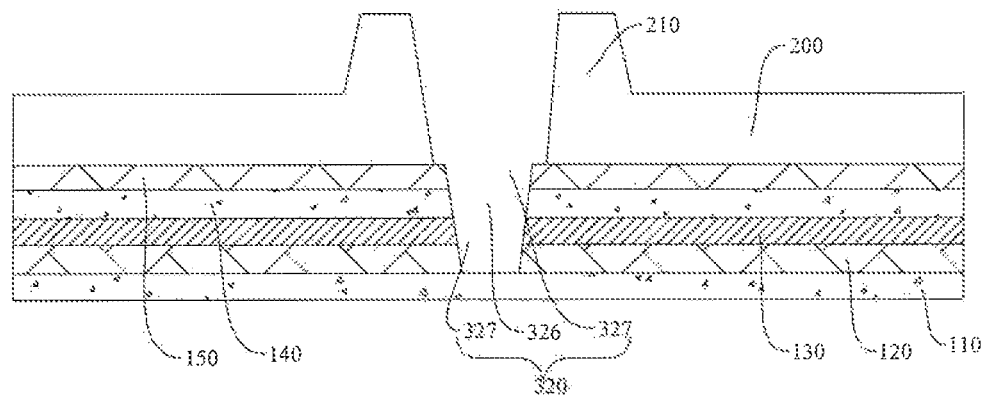
Figure 11D:
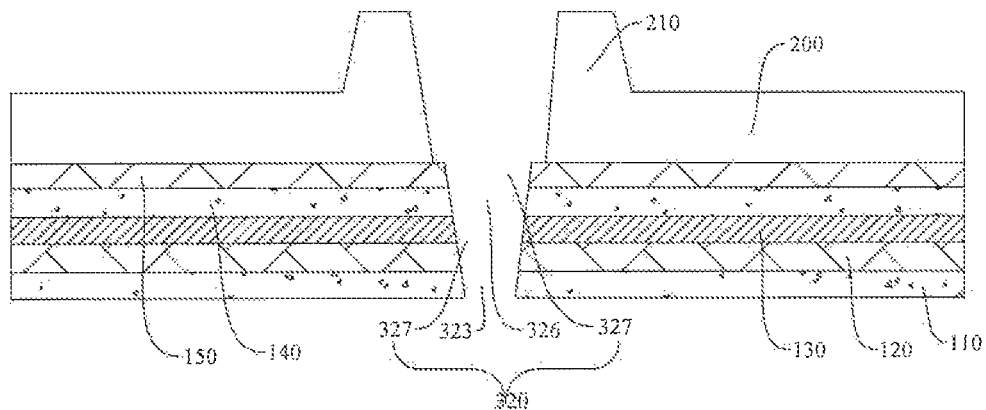

In some embodiments of the present disclosure, the base substrate is formed by the step (6), which includes: forming a first flexible layer 110; performing a third etching process on the first flexible layer 110 to form a third space 323 (the third space is covered by the second flexible layer, not illustrated in FIG. 11B); forming a first barrier layer 120 on a surface of the first flexible layer 110 close to the circuit structure layer 200; forming an amorphous silicon layer 130 on a surface of the first barrier layer 120 close to the circuit structure layer 200; performing a fourth etching process on the amorphous silicon layer 130 and the first barrier layer 120 to form a fourth space 324 and simultaneously removing a portion of the first barrier layer and a portion of the amorphous silicon layer that are located in the bending region; forming a second flexible layer 140 on a surface of the amorphous silicon layer 130 close to the circuit structure layer 200; forming a second barrier layer 150 on a surface of the second flexible layer 140 close to the circuit structure layer 200; performing a fifth etching process on the second barrier layer 150 to form a fifth space 325 and simultaneously removing a portion of the second barrier layer located in the bending region, and all of the third space 323, the fourth space 324, and the fifth space 325 constitute the second sub-hole 320. The structure as obtained is referred to FIG. 11B.

In some embodiments of the present disclosure, the base substrate is formed by the step (7), which includes: forming a first flexible layer 110; forming a first barrier layer 120 on a surface of the first flexible layer 110 close to the circuit structure layer 200; forming an amorphous silicon layer 130 on a surface of the first barrier layer 120 close to the circuit structure layer 200; forming a second flexible layer 140 on a surface of the amorphous silicon layer 130 close to the circuit structure layer 200; performing a sixth etching process on the second flexible layer 140 to form a sixth space 236; forming a second barrier layer 150 on a surface of the second flexible layer 140 close to the circuit structure layer 200; performing a seventh etching process on the first barrier layer 120, the amorphous silicon layer 130, and the second barrier layer 140 to form a seventh space 327 and simultaneously removing a portion of the first barrier layer, a portion of the amorphous silicon layer, and a portion of the second barrier layer that are located in the bending region, both the sixth space 326 and the seventh space 327 constitute the second sub-hole 320. The structure as obtained is referred to FIG. 11G.

In some embodiments of the present disclosure, the base substrate is formed by the step (8), which includes: forming a first flexible layer 110; performing a third etching process on the first flexible layer 110 to form a third space 323; forming a first barrier layer 120 on a surface of the first flexible layer 110 close to the circuit structure layer 200; forming an amorphous silicon layer 130 on a surface of the first barrier layer 120 close to the circuit structure layer 200; forming a second flexible layer 140 on a surface of the amorphous silicon layer 130 close to the circuit structure layer; performing a sixth etching process on the second flexible layer 140 to form a sixth space 326; forming a second barrier layer 150 on a surface of the second flexible layer 140 close to the circuit structure layer 200; performing a seventh etching process on the first barrier layer 120, the amorphous silicon layer 130, and the second barrier layer 150 to form a seventh space 327 and simultaneously removing a portion of the first barrier layer, a portion of the amorphous silicon layer and a portion of the second barrier layer that are located in the bending region, all of the third space 323, all of the third space 323, the sixth space 326 and the seventh space 327 constitute the second sub-hole 320. The structure as obtained is referred to FIG. 11D.

According to an embodiment of the present disclosure, as illustrated in FIG. 10A-FIG. 10D and FIG. 11A-FIG. 11D, an orthographic projection of the first sub-hole on the base substrate covers and is larger than an orthographic projection of the second sub-hole on the base substrate, that is, an etching area when forming the first sub-hole is larger than an etching area when forming the second sub-hole. In this way, the encapsulation of the OLED component in a subsequent process is facilitated, and an encapsulation thickness of the encapsulation film at an edge thereof is ensured, thereby improving the encapsulation effect of the OLED component.

The method for forming any of the first flexible layer, the second flexible layer, the first barrier layer, the second barrier layer, and the amorphous silicon layer is not particularly limited in the embodiments of the present disclosure, and any suitable method in the existing technology may be adopted by those skilled in the art. For example, the method includes, but is not limited to, physical vapor deposition (e.g., magnetron sputtering) and chemical vapor deposition (e.g., plasma enhanced chemical vapor deposition). In this way, the process is mature and easy to implement and manage. None of the steps of the first etching process to the seventh etching process is particularly limited in the embodiment of the present disclosure, and any suitable conventional technical process may be used by those skilled in the art without particularly describing herein.

Referring to FIG. 1, FIG. 10A-FIG. 10D, and FIG. 11A-FIG. 11D, step S200 includes: forming a circuit structure layer 200 on an upper surface of the base substrate 100; forming a via hole 300 penetrating the circuit structure layer 200; and providing a protrusion 210 in an annular shape on an upper surface of the circuit structure layer 200; the protrusion 210 surrounds the via hole 300. It should be explained that, in the embodiment in which the base substrate is not provided with the second sub-hole, the via hole refers to the first sub-hole.

The above manufacturing method provided by the embodiments of the present disclosure is convenient to implement, the process is mature, and the problem of difficulty in making via hole can be effectively solved. Furthermore, the arrangement of the protrusion can prevent the organic liquid from falling into the via hole, so that an organic encapsulation material would not be formed in the via hole any more, and a process for removing the organic encapsulation material in the via hole is omitted, thereby shortening the process flow and the process time. Moreover, the arrangement of the protrusion can also prevent the etchant from damaging the light-emitting material of the OLED component adjacent to the via hole, that is, effectively protecting the light-emitting material adjacent to the via hole against water and oxygen, thereby mitigating the occurrence of photon overflow, reducing the efficiency of non-radiative recombination, and improving the light-emitting efficiency of the flexible display panel. In addition, the arrangement of the protrusions can optimize a film structure of the base substrate.

According to an embodiment of the present disclosure, forming a circuit structure layer and forming a via hole penetrating the circuit structure layer may include, for example, the following steps S1-S13 (a schematic structural view illustrating the flexible display panel as formed is referred to FIG. 5).

Step S1 includes forming a buffer layer 212 on an upper surface of the base substrate 100.

Step S2 includes forming one of an active layer 2131 and a gate electrode 2132 on a surface of the buffer layer 212 away from the base substrate 100, so that an orthographic projection of the active layer 2131 adjacent to the via hole 300 on the base substrate 100 is not overlapped with an orthographic projection of the via hole 300 on the base substrate 100. In the embodiment in which a top-gate thin film transistor is formed, the active layer is formed in this step; in the embodiment in which a bottom-gate thin film transistor is formed, the gate electrode is formed in this step.

Step S3 includes forming a first gate insulation layer 214 on a surface of the buffer layer 212 away from the base substrate 100, so that the first gate insulation layer 214 covers the active layer 2131 or the gate electrode 2132.

Step S4 includes forming the other of the active layer 2131 and the gate electrode 2132 on a surface of the first gate insulation layer 214 away from the base substrate 100.

Step S5 includes forming a second gate insulation layer 215 on the surface of the first gate insulation layer 214 away from the base substrate 100 so that the second gate insulation layer 215 covers the gate electrode 2132 or the active layer 2131.

Step S6 includes forming a first conductive wire layer 216 on a surface of the second gate insulation layer 215 away from the base substrate 100.

Step S7 includes forming an interlayer dielectric layer 217 on the surface of the second gate insulation layer 215 away from the base substrate 100 so that the interlayer dielectric layer 217 covers the first conductive wire layer 216.

Step S8 includes performing a first etching process (EBA MASK, i.e., Etch Bending A MASK) on the buffer layer 212, the first gate insulation layer 214, the second gate insulation layer 215, and the interlayer dielectric layer 217 to form a first sub-hole and meanwhile removing a portion of the buffer layer, a portion of the first gate insulation layer, a portion of the second gate insulation layer and a portion of the interlayer dielectric layer that are located in the bending region of the flexible display panel; the first sub-hole constitutes the via hole 300.

According to an embodiment of the present disclosure, after the first etching process, the first sub-hole exposes a portion of the base substrate corresponding to the via hole, so that those skilled in the art may select to finish etching a structure such as a first barrier layer, a second barrier layer, and an amorphous silicon layer in the base substrate before forming the buffer layer or after the first etching process, depending on whether the first flexible layer or the second flexible layer is etched or not, in the embodiment in which a portion of the first flexible layer and a portion of the second flexible layer corresponding to a predetermined position are both patterned, the first flexible layer and the second flexible layer are patterned upon being formed, and then a seventh etching process (EBB MASK, i.e., Etch Bending B MASK) may be performed to form a seventh space after forming the first sub-hole by the first etching process so as to obtain a second sub-hole, or alternatively, the seventh etching process may be performed before forming the buffer layer. In the embodiment in which a portion of the first flexible layer and a portion of the second flexible layer corresponding to the predetermined position are not patterned, after forming the first barrier layer and the amorphous silicon layer, the first barrier layer and the amorphous silicon layer are required to be patterned, then the second flexible layer is formed, and then a second barrier layer is formed; the second barrier layer may be etched just after the second barrier layer is formed or may be etched after the first etching process. Through the above steps, the desired via hole can be obtained, and meanwhile an etching region for filling a flexible material can be obtained in the bending region. In this way, not only the etching process can be reduced, but also the process time for manufacturing the flexible display panel can be shortened, and the cost can be saved.

According to an embodiment of the present disclosure, EBA MASK and EBB MASK are two etching processes for etching a flexible bending region, thereby thinning the bending region to facilitate filling of the flexible material.

Step S9 includes forming a flexible filling layer 211 at a side of the interlayer dielectric layer 217 away from the base substrate 100, so that an orthographic projection of the protrusion 210 on the base substrate 100 covers an orthographic projection of the flexible filling layer 211 on the base substrate 100.

According to an embodiment of the present disclosure, in order to ensure a better performance of the flexible display panel and to ensure convenience of the manufacturing process, the flexible filling layer 211 is formed between the interlayer dielectric layer 217 and the pixel defining layer 219. In order to further reduce one time of etching process, a flexible filling material filled in the bending region may be synchronously formed by the same patterning process as a flexible material of the bending region, that is, the flexible filling layer 211 is located on a surface of the interlayer dielectric layer 217 away from the base substrate 100 (illustrated in FIG. 5), which can shorten the process flow.

Step S10 includes forming a source electrode 2133 and a drain electrode 2134 on the surface of the interlayer dielectric layer 217 away from the base substrate 100.

Step S11 includes forming a first planarization layer 218 on the surface of the interlayer dielectric layer 217 away from the base substrate 100, so that the first planarization layer 218 covers the source electrode 2133 and the drain electrode 2134; then removing a portion of the first planarization layer 218 located at a bottom wall and a sidewall of the via hole 300.

Step S12 includes forming a pixel defining layer 219 on a surface of the first planarization layer 218 away from the base substrate 100, so that an orthographic projection of the flexible filling layer 211 on the base substrate 100 covers an orthographic projection of the pixel defining layer 219 on the base substrate 100.

Step S13 includes forming a spacer layer 220 on a surface of the pixel defining layer 219 away from the base substrate 100.

According to an embodiment of the present disclosure, in order to prevent a formation of the via hole from affecting the thin film transistor, as illustrated in FIG. 5, an orthographic projection of the thin film transistor adjacent to the via hole on the base substrate and an orthographic projection of the via hole on the base substrate are not overlapped with each other. During forming the via hole, multiple etching processes are required. The above arrangement can effectively ensure that the multiple etching processes do not affect the thin film transistor. It should be explained that the thin film transistor mentioned in the present disclosure only includes an active layer, a gate electrode, a source electrode, and a drain electrode, and does not include an insulation layer structure such as a first gate insulation layer, a second gate insulation layer, or the like.

According to an embodiment of the present disclosure, a manufacturing method of a flexible display panel may further include the following steps S14-S16 (a schematic view of the structure as obtained is referred to FIG. 6).

Step S14 includes forming a passivation layer 221 on a surface of the first planarization layer 218 close to the base substrate 100, and removing a portion of the passivation layer 221 located at the bottom wall and the sidewall of the via hole 300.

Step S15 includes forming a second conductive wire layer 222 on the surface of the first planarization layer 218 away from the base substrate 100.

Step S16 includes forming a second planarization layer 223 on the surface of the first planarization layer 218 away from the base substrate 100, so that the second planarization layer 223 covers the second conductive wire layer 222; then removing a portion of the second planarization layer 223 located at the bottom wall and the sidewall of the via hole 300.

A method for forming at least one of a buffer layer, a first gate insulation layer, a second gate insulation layer, an interlayer dielectric layer, a first planarization layer, a passivation layer, a second planarization layer, and a pixel defining layer is not particularly limited in the embodiment of the present disclosure, and can be flexibly selected by those skilled in the art according to actual needs. In some embodiments of the present disclosure, the above layers may be formed by a method such as chemical vapor deposition (e.g., plasma enhanced chemical vapor deposition) and physical vapor deposition (e.g., magnetron sputtering). A method for removing a portion of the first planarization layer, a portion of the passivation layer, a portion of the second planarization layer, and the like in the via hole is not particularly limited in the embodiment of the present disclosure, and may be flexibly selected by those skilled in the art according to actual needs; for example, it can be removed by an etching process or the like.

According to an embodiment of the present disclosure, in order to enhance the strength of the protrusion, forming the circuit structure layer may further include forming a metal layer so that an orthographic projection of the protrusion on the base substrate covers an orthographic projection of the metal layer on the base substrate. According to an embodiment of the present disclosure, forming the metal layer includes at least one of: forming a first metal layer 231 by the same patterning process as the source electrode 2133; forming a second metal layer 232 by the same patterning process as the gate electrode 2132; forming a third metal layer 233 by the same patterning process as the first conductive wire layer 216; forming a fourth metal layer 234 by the same patterning process as the second conductive wire layer 222; and forming a fifth metal layer 235 by the same patterning process as an anode of the OLED component. The structure as obtained refers to FIG. 7A-FIG. 7B, FIG. 7A illustrates an embodiment in which the metal layer includes the first metal layer, the fourth metal layer, and the fifth metal layer, and FIG. 7B illustrates an embodiment in which the metal layer includes the first metal layer to the fifth metal layer. The above arrangement of the metal layer can effectively enhance the strength of the protrusion and improve the stability of the flexible display panel. Moreover, because the metal layer is formed by the same patterning process as one of the source electrode, the gate electrode, the first conductive wire layer, the second conductive wire layer, the anode, etc. of the flexible display panel, an etching process (MASK process) for separately fabricating the metal layer can be omitted, thereby reducing the cost. It should be explained that, in order not to affect the working performance of the flexible display panel, the above-described metal layers are not electrically connected to any of the conductive wire, the electrode, the source electrode, the drain electrodes, the gate electrode, and the like in the flexible display panel. For example, the first metal layer and the source electrode are formed by the same patterning process, which refers to that the first metal layer and the source electrode are obtained by etching a same metal film in a same patterning process, but the first metal layer and the source electrode are not electrically connected with each other; and the second metal layer to the fifth metal layer can refer to the first metal layer. In order to prevent the conductivity of each of the meal layers from affecting the flexible display panel, the above-mentioned metal layers may be grounded.

A method for forming the source electrode, the drain electrode, the first conductive wire layer, the gate electrode, the second conductive wire layer, and the anode of the OLED component is not particularly limited in the embodiment of the present disclosure, and may be flexibly selected by those skilled in the art according to actual needs without particularly describing herein.

According to an embodiment of the present disclosure, the manufacturing method of the flexible display panel may further include forming an encapsulation film 400 configured to encapsulate the OLED component 500 (a structure of the flexible display panel as obtained is referred to FIG. 8), including: forming a plurality of inorganic encapsulation layers and a plurality of organic encapsulation layers which are alternately arranged on a surface of the OLED component 500 away from the base substrate 100. FIG. 8 illustrates an embodiment in which the encapsulation film includes a first inorganic encapsulation layer 420, an organic encapsulation layer 410, and a second inorganic encapsulation layer 430 which are sequentially stacked. For example, the organic encapsulation layer is an organic encapsulation layer 410 formed by inkjet printing at a position which is around the protrusion 210 and is away from the via hole 300. A distance H1 between the base substrate 100 and a surface of the protrusion 210 away from the base substrate 100 is greater than or equal to a distance H2 between the base substrate 100 and a surface of an organic encapsulation layer farthest from the base substrate 100 in the encapsulation film 400 that is away from the base substrate 100, and the distance H1 between the base substrate 100 and the surface of the protrusion 210 away from the base substrate 100 may be smaller than a distance H3 between the base substrate 100 and a surface of the encapsulation film 400 away from the base substrate 100. In this way, it can be effectively ensured that the organic liquid does not fall into the via hole in the process of forming the organic encapsulation layer.

A structure of the encapsulation film is not particularly limited in the embodiment of the present disclosure, and can be flexibly selected by those skilled in the art according to actual needs. In order to achieve a better encapsulation effect, a first layer of the encapsulation film that is in contact with the OLED component is usually an inorganic layer, and a layer of the encapsulation film that is farthest from the OLED component generally is also an inorganic layer. In some embodiments of the present disclosure, as illustrated in FIG. 8, the encapsulation film may include a first inorganic encapsulation layer 420, an organic encapsulation layer 410, and a second inorganic encapsulation layer 430 which are sequentially stacked, so that a distance H1 between the base substrate 100 and a surface of the protrusion 210 away from the base substrate 100 is greater than or equal to a distance 112 between the base substrate 100 and a surface of the organic encapsulation layer 410 away from the base substrate 100, and the distance H1 between the base substrate 100 and the surface of the protrusion 210 away from the base substrate 100 is smaller than a distance H3 between the base substrate 100 and a surface of the second inorganic encapsulation layer 430 away from the base substrate 100. In other embodiments of the present disclosure, the encapsulation film may further include a plurality of inorganic encapsulation layers and a plurality of organic encapsulation layers that are alternately arranged, for example, it may further include a first inorganic encapsulation layer, a first organic encapsulation layer, a second inorganic encapsulation layer, a second organic encapsulation layer, a third inorganic encapsulation layer and a third organic encapsulation layer which are sequentially stacked.

A method for forming the organic encapsulation layer and the inorganic encapsulation layer is not particularly limited in the embodiment of the present disclosure, and may be flexibly selected by those skilled in the art according to the actual needs. For example, a method such as physical vapor deposition (e.g., magnetron sputtering) and chemical vapor deposition (e.g., plasma enhanced chemical vapor deposition) may be adopted.

According to an embodiment of the present disclosure, forming the inorganic encapsulation layer may include: forming an inorganic layer at a side of the OLED component away from the base substrate; and removing a portion of the inorganic layer in the via hole by an etching process to obtain an inorganic encapsulation layer. In some embodiments of the present disclosure, in order to further shorten the process flow for manufacturing a flexible display panel without affecting the encapsulating effect, the organic layer in the OLED component 500 and the inorganic encapsulation layer closest to the OLED component 500 (e.g., the first inorganic encapsulation layer 420 in FIG. 8) are formed by the same etching process. The organic layer in the OLED component 500 refers to at least one selected from the group consisting of a hole injection layer, a hole transport layer, an electron transport layer, and an electron injection layer.

A forming process of the OLED component in the embodiment of the present disclosure will be schematically explained below with reference to FIG. 12, in which an anode and a cathode of the OLED component are not illustrated.

Figure 12:
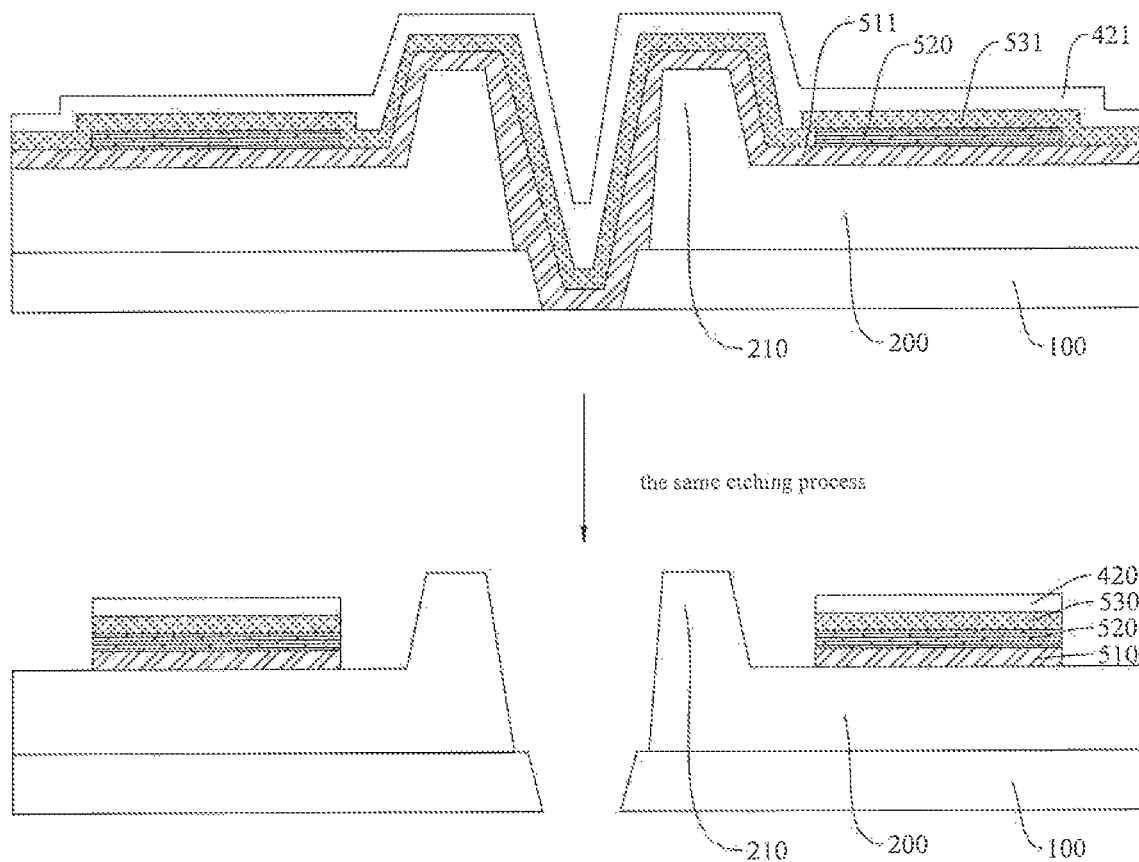
FIG. 12 is schematic views illustrating structures of a flexible display panel in various steps of a manufacturing method provided by still another embodiment of the present disclosure.

As illustrated in FIG. 12, the method includes depositing an initial hole injection layer 511, evaporating an initial light-emitting layer 520, depositing an initial electron transport layer 531, and depositing an initial inorganic encapsulation layer 421 on an upper surface of the circuit structure layer 200 in sequence, and then obtaining a patterned hole injection layer 510, a patterned electron transport layer 530, and a patterned first inorganic encapsulation layer 420 by the same etching process (i.e., an etching process using the same mask). In order to better etch the first inorganic encapsulation layer 421 and the organic layer such as the hole injection layer 510 and the electron transport layer 530, the organic layer such as the hole injection layer 510 and the electron transport layer 530 may be etched and patterned by plasma etching, and the first inorganic encapsulation layer 421 may be etched and patterned by wet etching; that is, during a single etching process, after finishing etching the organic layer, the plasma has to be replaced with an etchant to continue etching the first inorganic encapsulation layer.

According to an embodiment of the present disclosure, in order to better encapsulate the OLED component, an inorganic encapsulation layer (the second inorganic encapsulation layer 430 in FIG. 8 as an example) in the encapsulation film that is farthest from the OLED component may cover at least a portion of a sidewall of the via hole 300. That is, when the second inorganic encapsulation layer 430 is formed by etching, only a portion of the second inorganic encapsulation layer at a bottom wall of the vial hole and a portion of the second inorganic encapsulation layer at part of a sidewall of the via hole are completely etched away.

According to an embodiment of the present disclosure, the manufacturing method of the flexible display panel can be used for the flexible display panel described above, and the materials and configuration positions of the film layer structures in the flexible display panel (e.g., a buffer layer, a planarization layer, a passivation layer, a source electrode, a drain electrode, a gate electrode, a first conductive wire layer, a second conductive wire layer, a pixel defining layer, and the like) are the same as those of the flexible display panel described above, without repeated herein.

The above are only specific implementations of the present disclosure, without limiting the protection scope of the present disclosure thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A flexible display panel, comprising:
  a base substrate;
  a circuit structure layer located on an upper surface of the base substrate, a protrusion in an annular shape being provided at a side of the circuit structure layer away from the base substrate; and
  a via hole penetrating the circuit structure layer, the via hole being surrounded by the protrusion, wherein
  the circuit structure layer comprises:
  a buffer layer located on the upper surface of the base substrate;
  a thin film transistor which is located on a surface of the buffer layer away from the base substrate and comprises an active layer, a gate electrode, a source electrode, and a drain electrode;
  a first gate insulation layer located between the active layer and the gate electrode;
  a second gate insulation layer which is located on a surface of the first gate insulation layer away from the base substrate and covers the gate electrode or the active layer;
  a first conductive wire layer located on a surface of the second gate insulation layer away from the base substrate;
  an interlayer dielectric layer which is located on the surface of the second gate insulation layer away from the base substrate and covers the first conductive wire layer, wherein the source electrode and the drain electrode are located on a surface of the interlayer dielectric layer away from the base substrate;
  a first planarization layer which is located on the surface of the interlayer dielectric layer away from the base substrate and covers the source electrode and the drain electrode; and
  a second conductive wire layer located on the surface of the first planarization layer away from the base substrate, wherein
  the protrusion further comprises a metal layer, an orthographic projection of the protrusion on the base substrate covers an orthographic projection of the metal layer on the base substrate, and the metal layer is at least one selected from the group consisting of:

a first metal layer, the first metal layer and the source electrode being formed by a same material and located in a same layer;

a second metal layer, the second metal layer and the gate electrode being formed by a same material and locate in a same layer;

a third metal layer, the third metal layer and the first conductive wire layer being formed by a same material and located in a same layer;

a fourth metal layer, the fourth metal layer and the second conductive wire layer being formed by a same material and located in a same layer; and a fifth metal layer, the fifth metal layer and an anode of an organic light emitting diode (OLED) component being formed by a same material and located in a same layer.

2. The flexible display panel according to claim 1, wherein the circuit structure layer comprises a flexible filling layer, and an orthographic projection of the protrusion on the base substrate covers an orthographic projection of the flexible filling layer on the base substrate.

3. The flexible display panel according to claim 2, wherein the circuit structure layer further comprises:

a pixel defining layer located on a surface of the first planarization layer away from the base substrate; and a spacer layer located on a surface of the pixel defining layer away from the base substrate, wherein the flexible filling layer is located between the interlayer dielectric layer and the pixel defining layer.

4. The flexible display panel according to claim 3, wherein an orthographic projection of the thin film transistor adjacent to the via hole on the base substrate is not overlapped with an orthographic projection of the via hole on the base substrate.

5. The flexible display panel according to claim 3, wherein the flexible filling layer is located on the surface of the interlayer dielectric layer away from the base substrate.

6. The flexible display panel according to claim 3, wherein the circuit structure layer further comprises:

a passivation layer located on a surface of the first planarization layer close to the base substrate; and a second planarization layer which is located on the surface of the first planarization layer away from the base substrate and covers the second conductive wire layer.

7. The flexible display panel according to claim 1, wherein the base substrate comprises:

a first flexible layer;

a first barrier layer located between the first flexible layer and the circuit structure layer;

an amorphous silicon layer located on a surface of the first barrier layer close to the circuit structure layer;

a second flexible layer located on a surface of the amorphous silicon layer close to the circuit structure layer; and a second barrier layer located on a surface of the second flexible layer close to the circuit structure layer, and wherein the via hole penetrates the first barrier layer, or the via hole penetrates both the first barrier layer and the first flexible layer, or the via hole penetrates both the first barrier layer and the amorphous silicon layer, or the via hole penetrates the first barrier layer, the amorphous silicon layer, and the first flexible layer, or the via hole penetrates the amorphous silicon layer, the second barrier layer and the first barrier layer, or the via hole penetrates the amorphous silicon layer, the second barrier layer, the first barrier layer, and at least one of the second flexible layer and the first flexible layer.

8. The flexible display panel according to claim 1, further comprising an encapsulation film configured to encapsulate the OLED component, wherein the via hole penetrates the encapsulation film, and wherein a distance between the base substrate and a surface of the protrusion away from the base substrate is greater than or equal to a distance between the base substrate and a surface of an organic encapsulation layer farthest from the base substrate in the encapsulation film that is away from the base substrate, and the distance between the base substrate and the surface of the protrusion away from the base substrate is less than a distance between the base substrate and a surface of the encapsulation film away from the base substrate.

9. The flexible display panel according to claim 1, wherein the via hole comprises a first sub-hole and a second sub-hole that are communicated with each other, the first sub-hole penetrates the circuit structure layer, the second sub-hole penetrates the base substrate, and an orthographic projection of the first sub-hole on the base substrate is greater than an orthographic projection of the second sub-hole on the base substrate.

10. A manufacturing method of a flexible display panel, comprising:

forming a base substrate;

forming a circuit structure layer on an upper surface of the base substrate and forming a via hole penetrating the circuit structure layer; and providing a protrusion in an annular shape on an upper surface of the circuit structure layer so that the protrusion surrounds the via hole, wherein forming the circuit structure layer and forming the via hole penetrating the circuit structure layer comprise:

forming a buffer layer on the upper surface of the base substrate;

forming one of an active layer and a gate electrode on a surface of the buffer layer away from the base substrate so that an orthographic protection of the active layer adjacent to the via hole on the base substrate is not overlapped with an orthographic projection of the via hole on the base substrate;

forming a first gate insulation layer on the surface of the buffer layer away from the base substrate, so that the first gate insulation layer covers the active layer or the gate electrode;

forming the other of the active layer and the gate electrode on a surface of the first gate insulation layer away from the base substrate;

forming a second gate insulation layer on the surface of the first gate insulation layer way from the base substrate, so that the second gate insulation layer covers the gate electrode or the active layer;

forming a first conductive wire layer on a surface of the second gate insulation layer away from the base substrate;

forming an interlayer dielectric layer on the surface of the second gate insulation layer away from the base substrate, so that the interlayer dielectric layer covers the first conductive wire layer;

forming a source electrode and a drain electrode on a surface of the interlayer dielectric layer away from the base substrate;

forming a first planarization layer on the surface of the interlayer dielectric layer away from the base substrate so that the first planarization layer covers the source electrode and the drain electrode; and forming a second conductive wire layer on a surface of the first planarization layer away from the base substrate;

wherein forming the circuit structure layer further comprises: forming a metal layer, so that the orthographic protection of the protrusion on the base substrate covers an orthographic projection of the metal layer on the base substrate, and wherein forming the metal layer comprises at least one selected from the group consisting of:

forming a first metal layer by a same patterning process as the source electrode;

forming a second metal layer by a same patterning process as the gate electrode;

forming a third metal layer by a same patterning process as the first conductive wire layer;

forming a fourth metal layer by a same patterning process as the second conductive wire layer; and forming a fifth metal layer by a same patterning process as an anode of an organic light-emitting diode (OLED) component.

11. The method according to claim 10, wherein forming the circuit structure layer and forming the via hole penetrating the circuit structure layer further comprise:

performing a first etching process on the buffer layer, the first gate insulation layer, the second gate insulation layer, and the interlayer dielectric layer to form a first sub-hole and meanwhile removing a portion of the buffer layer, a portion of the first gate insulation layer, a portion of the second gate insulation layer, and a portion of the interlayer dielectric layer that are located in a bending region of the flexible display panel, the first sub-hole constituting the via hole;

forming a flexible filling layer at a side of the interlayer dielectric layer away from the base substrate, so that an orthographic projection of the protrusion on the base substrate covers an orthographic projection of the flexible filling layer on the base substrate, removing a portion of the first planarization layer located at a bottom wall and a sidewall of the via hole;

forming a pixel defining layer on a surface of the first planarization layer away from the base substrate, so that the flexible filling layer is between the interlayer dielectric layer and the pixel defining layer, and the orthographic projection of the flexible filling layer on the base substrate covers an orthographic projection of the pixel defining layer on the base substrate; and forming a spacer layer on a surface of the pixel defining layer away from the base substrate.

12. The method according to claim 11, further comprising:

forming a passivation layer on a surface of the first planarization layer close to the base substrate, and removing a portion of the passivation layer located on the bottom wall and the sidewall of the via hole;

forming a second planarization layer on a surface of the first planarization layer away from the base substrate, so that the second planarization layer covers the second conductive wire layer; and removing a portion of the second planarization layer located on the bottom wall and the sidewall of the via hole.

13. The method according to claim 11, wherein the via hole comprises a first sub-hole and a second sub-hole that are communicated with each other, the second sub-hole penetrates the base substrate, and wherein the base substrate is formed by any of the following (1) to (8):

(1)

forming a first flexible layer;

forming a first barrier layer on a surface of the first flexible layer close to the circuit structure layer, performing a second etching process on the first barrier layer to form a second space and meanwhile removing a portion of the first barrier layer located in the bending region, the second space constituting the second sub-hole, (2)

forming the first flexible layer, and performing a third etching process on the first flexible layer to form a third space;

forming the first barrier layer on a surface of the first flexible layer close to the circuit structure layer, performing the second etching process on the first barrier layer to form the second space and meanwhile removing a portion of the first barrier layer located in the bending region, both the second space and the third space constituting the second sub-hole, (3)

forming the first flexible layer;

forming the first barrier layer on a surface of the first flexible layer close to the circuit structure layer;

forming an amorphous silicon layer on a surface of the first barrier layer close to the circuit structure, performing a fourth etching process on the amorphous silicon layer and the first barrier layer to form a fourth space and meanwhile removing a portion of the first barrier layer and a portion of the amorphous silicon layer that are located in the bending region, the fourth space constituting the second sub-hole, (4)

forming the first flexible layer, and performing the third etching process on the first flexible layer to form the third space;

forming the first barrier layer on a surface of the first flexible layer close to the circuit structure layer; and forming the amorphous silicon layer on a surface of the first barrier layer close to the circuit structure layer, performing the fourth etching process on the amorphous silicon layer and the first barrier layer to form the fourth space and meanwhile removing a portion of the first barrier layer and a portion of the amorphous silicon layer that are located in the bending region, both the third space and the fourth space constituting the second sub-hole, (5)

forming the first flexible layer;

forming the first barrier layer on a surface of the first flexible layer close to the circuit structure layer;

forming the amorphous silicon layer on a surface of the first barrier layer close to the circuit structure, performing the fourth etching process on the amorphous silicon layer and the first barrier layer to form the fourth space and meanwhile removing a portion of the first barrier layer and a portion of the amorphous silicon layer that are located in the bending region;

forming a second flexible layer on a surface of the amorphous silicon layer close to the circuit structure layer;

forming a second barrier layer on a surface of the second flexible layer close to the circuit structure layer, performing a fifth etching process on the second barrier layer to form a fifth space and meanwhile removing a portion of the second barrier layer located in the bending region, both the fourth space and the fifth space constituting the second sub-hole, (6)

forming the first flexible layer, and performing the third etching process on the first flexible layer to form the third space;

forming the first barrier layer on a surface of the first flexible layer close to the circuit structure layer;

forming the amorphous silicon layer on a surface of the first barrier layer close to the circuit structure layer, performing the fourth etching process on the amorphous silicon layer and the first barrier layer to form the fourth space and meanwhile removing a portion of the first barrier layer and a portion of the amorphous silicon layer that are located in the bending region;

forming a second flexible layer on a surface of the amorphous silicon layer close to the circuit structure layer;

forming a second barrier layer on a surface of the second flexible layer close to the circuit structure layer, performing the fifth etching process on the second barrier layer to form the fifth space and meanwhile removing a portion of the second barrier layer located in the bending region, all of the third space, the fourth space and the fifth space constituting the second sub-hole, (7)

forming the first flexible layer;

forming the first barrier layer on a surface of the first flexible layer close to the circuit structure layer;

forming the amorphous silicon layer on a surface of the first barrier layer close to the circuit structure layer;

forming the second flexible layer on a surface of the amorphous silicon layer close to the circuit structure layer, and performing a sixth etching process on the second flexible layer to form a sixth space;

forming the second barrier layer on a surface of the second flexible layer close to the circuit structure layer, performing a seventh etching process on the first barrier layer, the amorphous silicon layer, and the second barrier layer to form a seventh space and meanwhile removing a portion of the first barrier layer, a portion of the amorphous silicon layer, and a portion of the second barrier layer that are located in the bending region, both the sixth space and the seventh space constituting the second sub-hole, (8)

forming the first flexible layer, and performing the third etching process on the first flexible layer to form the third space;

forming the first barrier layer on a surface of the first flexible layer close to the circuit structure layer;

forming the amorphous silicon layer on a surface of the first barrier layer close to the circuit structure layer;

forming the second flexible layer on a surface of the amorphous silicon layer close to the circuit structure layer, and performing the sixth etching on the second flexible layer to form the sixth space;

forming the second barrier layer on a surface of the second flexible layer close to the circuit structure layer, performing the seventh etching process on the first barrier layer, the amorphous silicon layer, and the second barrier layer to form the seventh space and meanwhile removing a portion of the first barrier layer, a portion of the amorphous silicon layer, and a portion of the second barrier layer that are located in the bending region, all of the third space, the sixth space, and the seventh space constituting the second sub-hole.

14. The method according to claim 13, wherein an orthographic projection of the first sub-hole on the base substrate is greater than an orthographic projection of the second sub-hole on the base substrate.

15. The method according to claim 10, further comprising forming an encapsulation film configured to encapsulate the OLED component, wherein forming the encapsulation film configured to encapsulate the OLED component comprises:

forming a plurality of inorganic encapsulation layers and a plurality of organic encapsulation layers that are alternately arranged on a surface of the OLED component away from the base substrate, wherein the plurality of inorganic encapsulation layers are formed at a position which is around the protrusion and away from the via hole by an inkjet printing process, wherein a distance between the base substrate and a surface of the protrusion away from the base substrate is greater than or equal to a distance between the base substrate and a surface of an organic encapsulation layer farthest from the base substrate in the organic encapsulation film that is away from the base substrate, and wherein a distance between the base substrate and the surface of the protrusion away from the base substrate is less than a distance between the base substrate and a surface of the encapsulation film away from the base substrate.

16. The method according to claim 15, wherein forming the inorganic encapsulation layer comprises:

forming an inorganic layer at a side of the OLED component away from the base substrate; and removing a portion of the inorganic layer located in the via hole by an etching process to obtain the inorganic encapsulation layer, wherein an organic layer in the OLED component and the inorganic encapsulation layer closest to the OLED component are formed by a single etching process, and wherein the organic layer in the OLED component is at least one selected from the group consisting of a hole injection layer, a hole transport layer, an electron transport layer, and an electron injection layer in the OLED component.

* * * * *